United States Patent
Jang

(10) Patent No.: US 7,269,699 B2
(45) Date of Patent: Sep. 11, 2007

(54) METHOD AND MEMORY SYSTEM HAVING MODE SELECTION BETWEEN DUAL DATA STROBE MODE AND SINGLE DATA STROBE MODE WITH INVERSION

(75) Inventor: Seong-Jin Jang, Seongnam (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 344 days.

(21) Appl. No.: 10/733,413

(22) Filed: Dec. 12, 2003

(65) Prior Publication Data

US 2005/0005053 A1      Jan. 6, 2005

(30) Foreign Application Priority Data

Jul. 4, 2003     (KR)     ............. 10-2003-0045413

(51) Int. Cl.
*G06F 12/00*     (2006.01)
*G11C 7/00*     (2006.01)

(52) U.S. Cl. ............... 711/154; 711/100; 365/189.01; 365/190; 365/225.7

(58) Field of Classification Search ............... 711/100, 711/154; 365/190, 225.7
See application file for complete search history.

(56) References Cited

U.S. PATENT DOCUMENTS

| 5,155,839 A * | 10/1992 | Weppler ............... 710/65 |
|---|---|---|
| 5,426,606 A | 6/1995 | Takai |
| 5,598,376 A | 1/1997 | Merritt et al. |
| 6,016,066 A | 1/2000 | Ilkbahar |
| 6,064,627 A | 5/2000 | Sakurai |
| 6,188,638 B1 * | 2/2001 | Kuhne ............... 365/233 |
| 6,384,346 B1 * | 5/2002 | Chang et al. ............ 174/261 |
| 6,466,511 B2 | 10/2002 | Fujita et al. |
| 6,898,648 B2 * | 5/2005 | LaBerge ............... 710/100 |
| 6,937,534 B2 * | 8/2005 | Lim et al. ............ 365/222 |
| 2003/0009617 A1 | 1/2003 | Cohen |
| 2005/0078548 A1 | 4/2005 | Kang et al. |

FOREIGN PATENT DOCUMENTS

| DE | 4408876 A1 | 9/1994 |
|---|---|---|
| JP | 7-282580 A | 10/1995 |
| KR | 1998-019814 A | 6/1998 |
| KR | 2003-0039179 A | 5/2003 |

OTHER PUBLICATIONS

"ELPIDA 128M bits Self Terminated Interfaced DDR SDRAM" data sheets, Nov. 2002, pp. 1-46.

* cited by examiner

*Primary Examiner*—Matthew Kim
*Assistant Examiner*—Shane M Thomas
(74) *Attorney, Agent, or Firm*—Volentine & Whitt, PLLC

(57) ABSTRACT

A memory system and a method of reading and writing data to a memory device selectively operate in both a single DQS mode with data inversion, and in a dual DQS mode. The device and method employ data strobe mode changing means for selectively changing operation of the memory device between a first data strobe mode and a second data strobe mode.

35 Claims, 37 Drawing Sheets

SINGLE DQS MODE MEMORY DEVICE WITHOUT DATA INVERSION SCHEME

DUAL DQS MODE MEMORY DEVICE

SINGLE DQS MODE MEMORY DEVICE WITH DATA INVERSION SCHEME

SETUP TIME : tS3>tS1, tS2>tS1
HOLD TIME: tH3>tH1, tH2>tH1

: VALID DATA REGION
: INVALID REGION

METHOD AND MEMORY SYSTEM HAVING MODE SELECTION BETWEEN DUAL DATA STROBE MODE AND SINGLE DATA STROBE MODE WITH INVERSION

CROSS-REFERENCES TO RELATED APPLICATIONS

This application claims priority under 35 U.S.C § 119 from Korean Patent Application No. 2003-45413, filed on 4 Jul. 2003 the entirety of which is hereby incorporated by reference for all purposes as if fully set forth herein.

BACKGROUND AND SUMMARY

1. Field

This invention pertains to the field of memory systems, and more particularly, to a memory system and a method of reading and writing data to a memory device that includes mode selection between a dual data strobe mode and a single data strobe mode with data inversion.

2. Description

Generally, it is a goal to improve the data transfer speed of a memory system. To this end, various techniques are employed to improve the high frequency characteristics (speed) of a memory device. In general, there are two types of memory devices: a single DQS (data strobe) mode memory device, and a dual, or differential, DQS (data strobe) mode memory device. In the case of the differential DQS mode memory device, the differential data strobe signals make it possible to improve the high frequency characteristics of the memory device by improving the noise margin. Meanwhile, for the single DQS mode memory device, a data inversion scheme is employed to reduce the simultaneous switching noise in the device and thereby improve the high frequency operating characteristics. Examples of both types of memory devices will now be described in further detail.

FIG. 1 is a block diagram of a conventional memory system 1 with a single DQS memory device 100 and a memory controller 200.

The memory system 1 operates with a data inversion scheme, as follows. During a data write operation, the signals DM<0:3> perform a data masking operation, WDQS<0:3> operate as data strobe signals, and DIM is a data inversion flag in indicating whether or not the data (all four data bytes) should be inverted. During a data read operation, the signals RDQS<0:3> operate as data strobe signals, and DM<0:3> serve as data inversion flags.

FIG. 2 shows an exemplary ball (or pin) configuration of a conventional single DQS mode memory device 1 with the data inversion scheme. As can be seen from FIG. 2, a total of eight separate pins are required for the RDQS<0:3> and WDQS<0:3> data strobe signals.

FIG. 3 shows a data processing block diagram of a conventional single DQS mode memory device 100. The memory device 100 includes data processing circuit 110 for byte0, data processing circuit 120 for byte1, data processing circuit 130 for byte2, data processing circuit 140 for byte3, and memory cell array 150. In the memory device 100, each single bit of the RDQS<0:3> data strobe signals at pins 111, 121, 131 and 141, and the WDQS<0:3> data strobe signals at pins 112, 122, 132 and 142, is dedicated to one data processing unit 110, 120, 130 or 140 for processing one eight-bit byte of data for the memory cell array 150. During a data write operation, DM<0:3> at pins 114, 124, 134, and 144, masks write data for the four data processing circuits 110, 120, 130 and 140. Meanwhile, during a data read operation, each single bit of the DM<0:3> signals is dedicated as a read data inversion flag for one of the data processing unit 110, 120, 130 or 140. On the other hand, during a data read operation, DIM at pin 160 is used as a write data inversion flag for all four data bytes. Four bytes of data comprising DQ<0:31> are input/output at the input/output pins 113, 123, 133 and 143.

FIG. 4 shows a block diagram of the byte0 data processing circuit 110 of the single DQS mode memory device 100. The data processing circuits 120, 130, and 140 in FIG. 3 are configured similarly to data processing circuit 110. The data processing circuit 110 comprises a number of components, including data strobe signal generator 113, data control circuit 114, and data inversion block 115. Data strobe signal generator 113 generates the read data strobe signal RDQS0. Data control circuit 114 controls data input/output during both data read and data write operations. DM0 performs two functions: it masks write data for byte0 during a data write operation, and it serves to output the read data inversion flag R_FLAG0 during a data read operation. Meanwhile, DIM provides the write data inversion flag W_FLAG0 during a data write operation. Data inversion block 115 performs a data inversion process during data read and data write operations according to the logical values of flags R_FLAG0 and W_FLAG, respectively.

FIG. 5 shows a conventional data inversion block 115. The data inversion block 115 includes the data toggle detection circuit 115-1 and the data inversion circuit 115-2. The data toggle detection circuit 115-1 detects whether the read data from the memory cell array 150 are inverted or not, and then outputs the read data inversion flag R_FLAG0 having the corresponding logic state. Data inversion circuit 115-2 inverts the data being written to, or read from, the memory cell array 150 according to the logical value of the W_FLAG in a data write mode, or the R_FLAG0 in a data read mode.

The data inversion block 115 reduces the simultaneous switching noise in the input/output buffers of the memory device 100 and thereby improves the high frequency characteristics of the device.

FIG. 6 shows a conventional data toggle detection circuit 115-1. The data toggle detection circuit 115-1 compares input data DATA_INT<0:7> with a reference terminal having a reference current capability of 3.5 units. If, for example, DATA_INT<0:7> is 11111110, then the node N1 will be pulled down to a logical low state (0), and the output signal R_FLAG0 will be in a logical high state (1). Meanwhile, if DATA_INT<0:7> is 11100000, then the node N1 will be pulled up to a logical high state (1), and the output signal R_FLAG0 will be in a logical high state (0). Accordingly, if the number of bits of DATA_INT<0:7> which are logically high are greater than 4, then R_FLAG0 will be logically high, while if the number of bits of DATA_INT<0:7> which are logically high are less than 4, then R_FLAG0 will be logically low.

FIG. 7 shows a conventional data inversion circuit 115-2. The data inversion circuit 115-2 includes data inverters 116-1, 116-2, 116-3, 116-4, 116-5, 116-6, 116-7, and 116-8. The data inverters 116-2, 116-3, 116-4, 116-5, 116-6, 116-7, and 116-8 in FIG. 7 are configured similarly to data inverter 116-1. During a data read operation, the READ signal closes the switches S5 and S7, while the R_FLAG0 signal closes one of the switches S1 and S2 depending upon whether the corresponding data bit is to be inverted or not. Similarly, during a data write operation, the WRITE signal closes the switches S6 and S8, while the W_FLAG signal closes one of the switches S3 and S4 depending upon whether the corresponding data bit is to be inverted or not.

FIG. 8 shows a timing diagram of a single DQS mode memory device with a data inversion scheme. In particular, the timing diagram of FIG. 8 shows a single DQS mode memory device with so-called "Burst-4" operation wherein four data bytes are written to, or read from, the memory device in a sequential burst. As can be seen from FIG. 8, read data (Q0, Q1, Q2, and Q3) are output from the memory device in sync with the rising edge of RDSQ0. Meanwhile, write data (D0, D1, D2, and D3) are input to the memory device in sync with the center of the WDQS0 pulses (center strobing). Furthermore, DM0 operates as a read data inversion flag during data read operations, and to mask write data during data write operations. DIM operates as a write data inversion flag during data write operations.

Accordingly, operation of a conventional memory system 1 with a single DQS memory device 100 operating with data inversion and a memory controller 200 has now been explained in relevant part with respect to FIGS. 1-8.

As mentioned above, there is also another type of memory system employing a dual, or differential, DQS mode memory device.

FIG. 9 shows a block diagram of a conventional memory system 2 with a differential DQS mode memory device 300 and a memory controller 400.

The differential DQS<0:3> and /DQS<0:3> signals operate as data strobes during both data read and data write operations. During a data write operation, the signals DM<0:3> perform a data masking operation. Because the differential DQS mode memory device 300 does not employ data inversion, there is no need for the DIM pin in the differential DQS mode memory device 300.

FIG. 10 shows an exemplary ball (or pin) configuration of a conventional differential DQS mode memory device 400. As can be seen from FIG. 9, a total of eight separate pins are required for the DQS<0:3> and /DQS<0:3> data strobe signals.

FIG. 11 shows a data processing block diagram of a conventional differential DQS mode memory device 300. The differential DQS mode memory device 300 includes data processing circuit 310 for byte0, data processing circuit 320 for byte1, data processing circuit 330 for byte2, data processing circuit 340 for byte3, and memory cell array 350. In the memory device 300, each single bit of the IDQS<0:3> data strobe signals at pins 311, 321, 331 and 341, and the DQS<0:3> data strobe signals at pins 312, 322, 332 and 342, is dedicated to one data processing unit 310, 320, 330 or 340 for processing one eight-bit byte of data for the memory cell array 350. During a data write operation, DM<0:3> at pins 314, 324, 334, and 344 masks write data for the four data processing circuits 310, 320, 330 and 340. Four bytes of data comprising DQ<0:31> are input/output at the input/outputs 313, 323, 333 and 343.

FIG. 12 shows a block diagram of a conventional byte0 data processing circuit 310. of the single DQS mode memory device 300. The data processing circuits 320, 330, and 340 in FIG. 11 are configured similarly to data processing circuit 310. The data processing circuit 310 comprises a number of components, including data strobe signal control circuit 313 and data control circuit 314. Data strobe signal generator 313 generates the data strobe signals DQS0 and /DQS0 during data read operations, and receives the data strobe signals DQS0 and /DQS0 during data write operations. Data control circuit 314 controls data input/output during both data read and data write operations. DM0 masks write data during a data write operation.

FIG. 13 shows a timing diagram of a differential DQS mode memory device without a data inversion circuit. In particular, the timing diagram of FIG. 13 shows a differential DQS mode memory device with so-called "Burst-4" operation wherein four data bytes are written to, or read from, the memory device in a sequential burst. As can be seen from FIG. 13, read data (Q0, Q1, Q2, and Q3) are output from the memory device in sync with the rising edge of RDSQ0. Meanwhile, write data (D0, D1, D2, and D3) are input to the memory device in sync with the center of the WDQS0 pulses (center strobing). Furthermore, DM0 is provided to mask write data during data write operations.

FIGS. 39-41 are provided to help explain how the dual (differential) DQS mode memory device and the single DQS mode memory device with a data inversion scheme can have improved high frequency characteristics (speed) compared to a single DQS mode memory device without data inversion. FIG. 39 shows a timing diagram of a read operation of a single DQS mode memory device, FIG. 40 shows a timing diagram of a read operation of a dual (differential) DQS mode memory device, and FIG. 41 shows a timing diagram of a read operation of a single DQS mode memory device with a data inversion scheme. In FIGS. 39-41, "MD" means "memory device," and "MC" means "memory controller." In each case, the memory controller receives data (DQ's) accompanied with a data strobe signal (DQS). The windows tS1 and tH1 are timing margins for the data DQ's and the data strobe signal DQS.

FIGS. 39-41 illustrate how a dual (differential) DQS mode memory device improves the high frequency characteristics by decreasing the invalid regions of the DQS signal. Meanwhile, the single DQS mode memory device improves the high frequency characteristics by decreasing the invalid regions of the DQ's.

As can be seen above, the configuration and operation of a memory system with the single DQS memory device employing the data inversion scheme are significantly different from the configuration and operation of a memory system with the differential DQS memory device. Depending upon the memory system, the proper memory device must be employed. That is, a single DQS memory system designed to employ data inversion will not properly operate with a differential DQS memory device without a data inversion circuit. Similarly, a differential DQS memory system without data inversion will not properly operate with a single DQS memory device with a data inversion circuit.

Accordingly, it would be advantageous to provide a method and memory system that can operate in both a single DQS mode with data inversion, and in a dual, or differential, DQS mode. It would also be advantageous to provide a memory device capable of operating with both a single DQS memory system designed to employ data inversion, and with a differential DQS memory system without data inversion. Other and further objects will appear hereinafter.

The present invention is directed toward a method and memory system that can operate in both a single DQS mode with data inversion, and in a dual DQS mode.

In one aspect of the invention, a memory system comprises: a memory device having a memory cell array adapted to store data and a data inversion circuit adapted to selectively invert the data when it is written into and read from the memory cell array; a controller connected to the memory device and adapted to write the data into the memory device and to read the data out of the memory device in response to data strobe signals; and data strobe mode changing means for selectively changing operation of the memory device between a first data strobe mode and a second data strobe mode. In the first data strobe mode, the data strobe signals comprise a write data strobe signal for writing data into the memory device and a read data strobe signal for reading data from the memory device. In the second data strobe mode the data strobe signals comprise a pair of differential data strobe signals for writing data into and reading data from the memory device.

In another aspect of the invention, a memory device comprises: a memory cell array adapted to store data; a data input/output (I/O) bus through which the data is written into and read from the memory device; a data inversion circuit adapted to selectively invert the data when it is written into and read from the memory cell array; and data strobe mode changing means for selectively changing operation of the memory device between a first data strobe mode, a second data strobe mode, and a third data strobe mode. In the first data strobe mode, the data strobe signals comprise a write data strobe signal for writing data into the memory device and a read data strobe signal for reading data from the memory device and the data inversion circuit is controlled to selectively invert the data. In the second data strobe mode, the data strobe signals comprise a pair of differential data strobe signals for writing data into and reading data from the memory device without any data inversion. In the third data strobe mode, the data strobe signals comprise a pair of differential data strobe signals for writing data into and reading data from the memory device, and the data inversion circuit is controlled to selectively invert the data.

In yet another aspect of the invention, a memory system comprises: a memory device having a memory cell array adapted to store data in a plurality of data words, wherein each data word comprises a plurality of data bytes; and a controller connected to the memory device and adapted to write the data into the memory device and to read the data out of the memory device, wherein the memory device further comprises means for selectively inverting individual bytes of the data when the data is written into and read from the memory cell array.

In still another aspect of the invention, a memory device comprises a memory cell array adapted to store data in a plurality of data words, wherein each data word comprises a plurality of data bytes, and means for selectively inverting individual bytes of the data when the data is written into the memory cell array.

In a further aspect of the invention, a method of writing data to a memory cell in a memory device, wherein the data comprises a plurality of data words and each data word comprises a plurality of data bytes, comprises receiving a data word at a data input of the memory device; receiving a plurality of write data inversion flags at the memory device, each write data inversion flag indicating whether a corresponding byte of the received data word should be inverted; selectively inverting individual bytes of the received data word according to the write data inversion flags; and writing the selectively inverted data word into the memory cell.

In yet a further aspect of the invention, a method of outputting data to be written to a memory cell comprises: selectively inverting individual bytes of a data word; setting a plurality of write data inversion flags, each write data inversion flag indicating whether a corresponding byte of the data word is inverted; outputting the selectively inverted data word; and outputting the plurality of write data inversion flags.

In a still further aspect of the invention, a method of communicating data between a controller and a memory device, wherein the data comprises a plurality of data words and each data word comprises a plurality of data bytes, comprises: selectively inverting individual bytes of a data word; setting a plurality of write data inversion flags, each write data inversion flag indicating whether a corresponding byte of the data word is inverted; outputting the selectively inverted data word; outputting the plurality of write data inversion flags; receiving the selectively inverted data word at a data input of the memory device; receiving the plurality of write data inversion flags at the memory device; selectively inverting individual bytes of the received data word according to the write data inversion flags; and writing the selectively inverted received data word into a memory cell array of the memory device.

Further aspects will become evident in the detailed description to follow.

DETAILED DESCRIPTION

Figure 14:
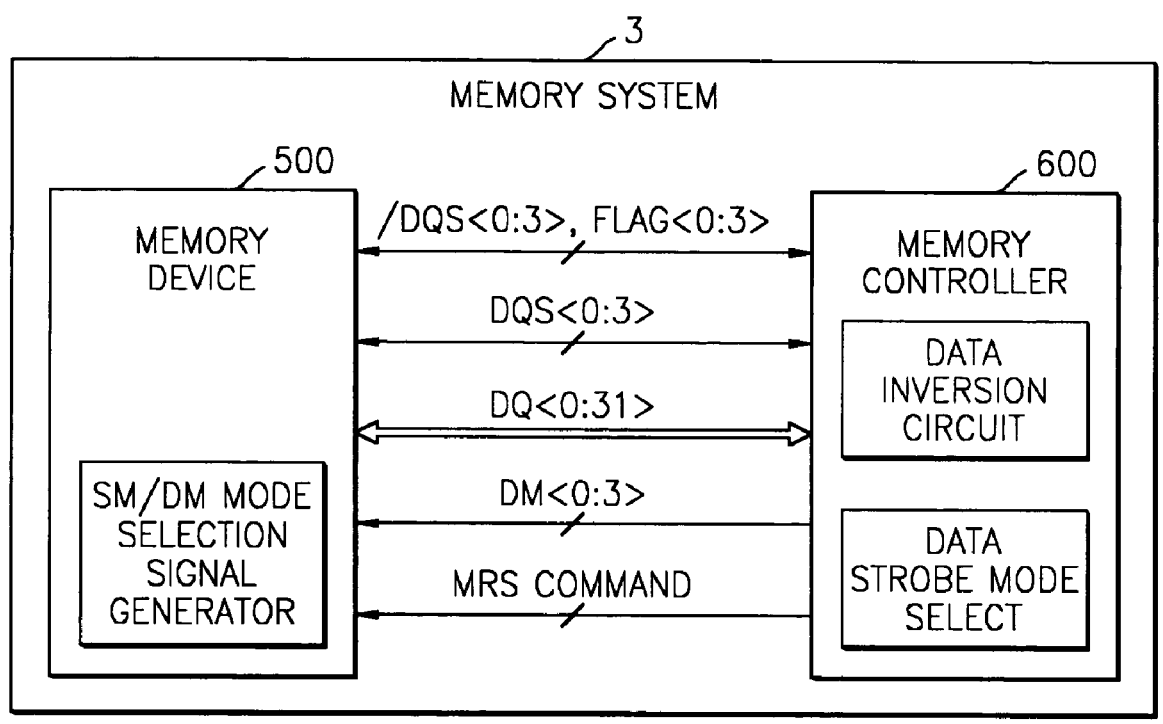
FIG. 14 shows a block diagram of a first embodiment of memory system according to one or more aspects of the present invention.

FIG. 14 shows a block diagram of a first embodiment of a memory system. The memory system 3 includes a memory device 500 and a memory controller 600. As explained in further detail below, the memory device 500 can operate in a first (single DQS) data strobe mode with data inversion, or in a second (differential DQS) data strobe mode without data inversion.

The memory controller includes a data inversion circuit and data strobe mode changing means providing a mode register set (MRS) command to the memory device 500. The MRS command includes information for selecting between the single DQS (SM) mode with data inversion, and the differential DQS (DM) mode without data inversion.

Beneficially, the memory device 500 includes a first embodiment of a SM/DM mode selection signal generator 700. The SM/DM mode selection signal generator 700 receives the MRS command, and in response thereto selects either the first or second data strobe mode for the memory device.

Figure 10:
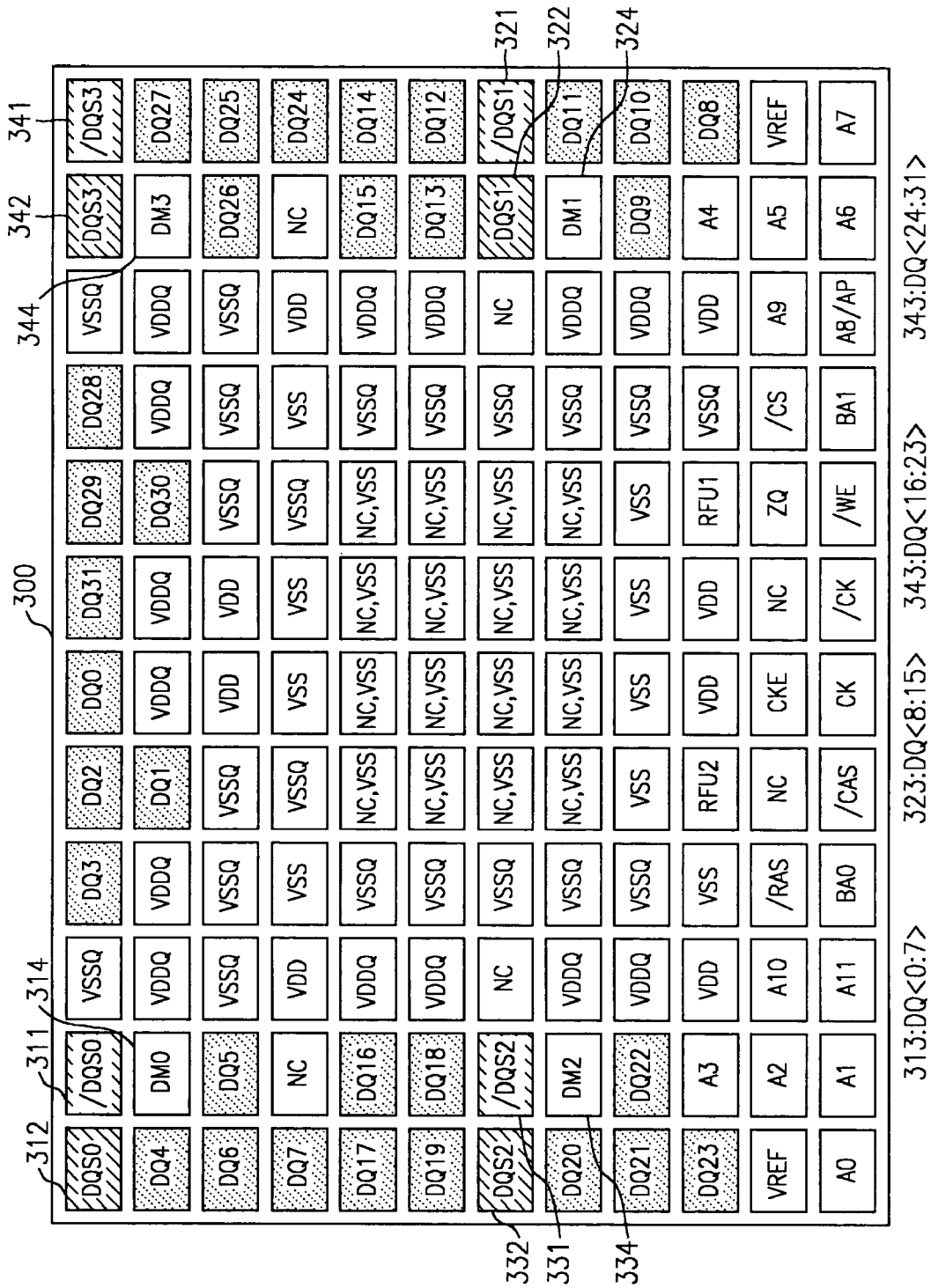
FIG. 10 shows a ball (or pin) configuration of a conventional differential DQS mode memory device.
Figure 15:
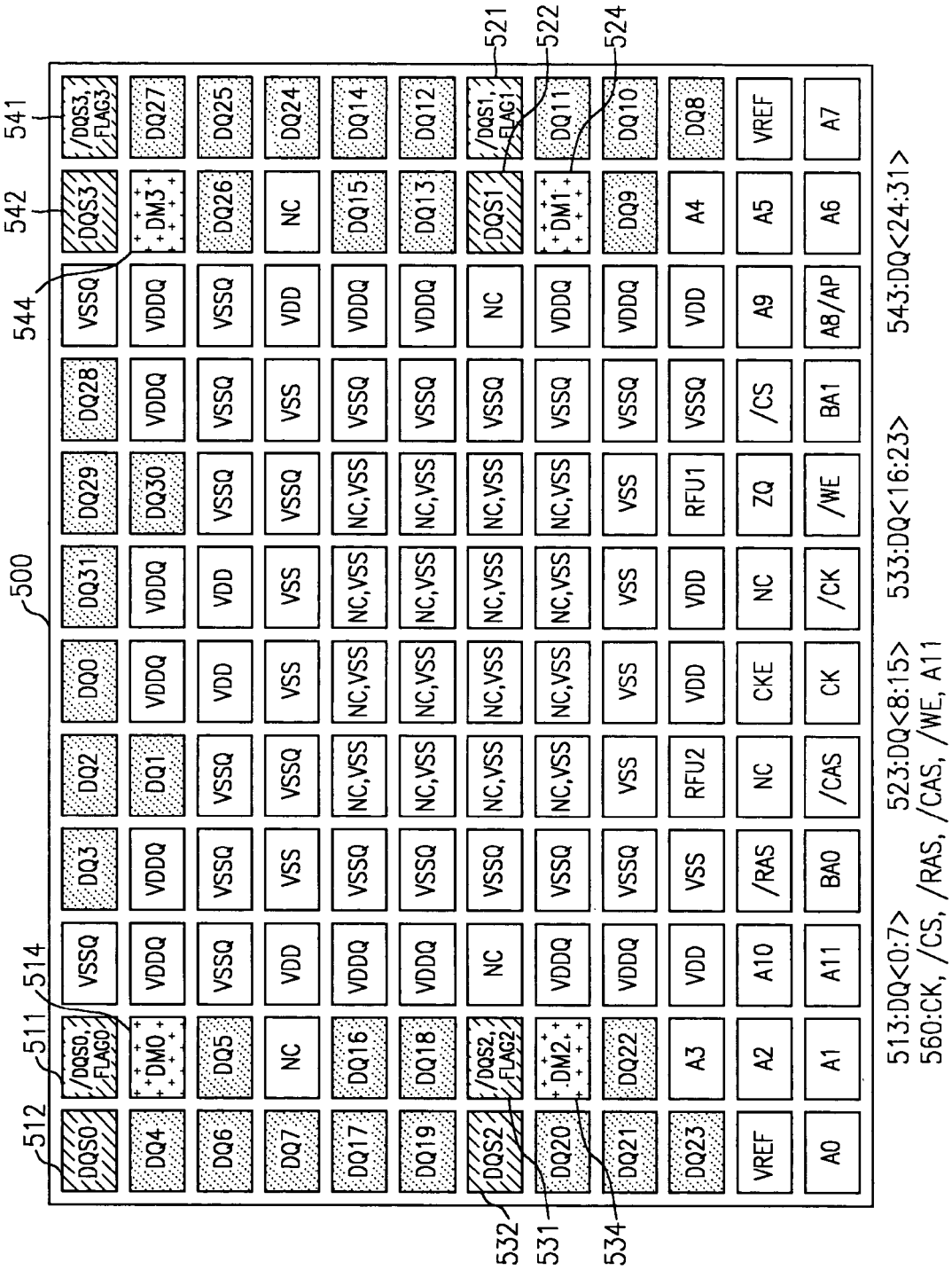
FIG. 15 shows a ball (or pin) configuration of a memory device.

FIG. 15 shows an exemplary ball (or pin) configuration of the memory device 500. As can be seen from FIG. 15, the names of the balls (or pins) are the same as for the differential DQS (DM) memory device shown in FIG. 10. However, as will be explained in further detail below, the functions of some of the signals on the balls (or pins) are different in accordance with a logical value of the mode selection signal.

Figure 16:
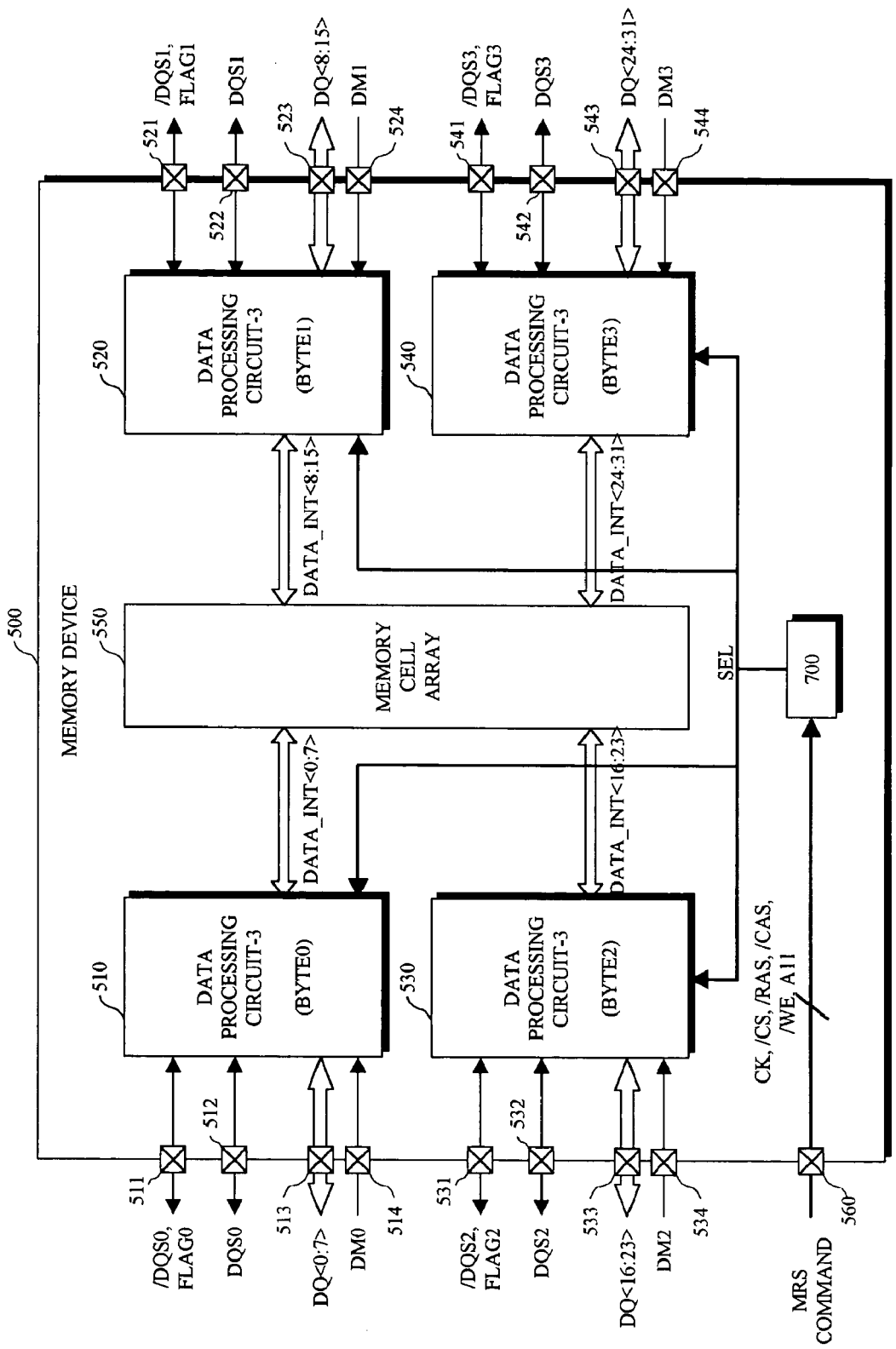
FIG. 16 shows a data processing block diagram of a first embodiment of a memory device according to one or more aspects of the present invention.

FIG. 16 shows a data processing block diagram of a first embodiment of a memory device 500. The memory device 500 includes data processing circuit 510 for byte0, data processing circuit 520 for byte1, data processing circuit 530 for byte2, data processing circuit 540 for byte3, and memory cell array 550. In the memory device 500, each single bit of the /DQS<0:3>,FLAG<0:3> data strobe signals at pins 511, 521, 531 and 541, and the DQS<0:3> data strobe signals at pins 512, 522, 532 and 542, is dedicated to one data processing unit 510, 520, 530 or 540 for processing one eight-bit byte of data for the memory cell array 550. During a data write operation, DM<0:3> at pins 514, 524, 534, and 544 masks write data for the four data processing circuits 510, 520, 530 and 540. Four bytes of data comprising DQ<0:31> are input/output at the input/outputs 513, 523, 533 and 543.

Beneficially, the memory device 500 includes the SM/DM mode selection signal generator 700 that receives the MRS command and in response thereto generates an SM/DM mode selection signal SEL that selects either the first or second data strobe mode for the memory device, as will be explained in further detail below. As indicated in FIG. 16, the MRS command may comprise a particular logical combination of a plurality of input signals (e.g., CK, /CS, /RAS, /CAS, /WE and A11).

Figure 17:
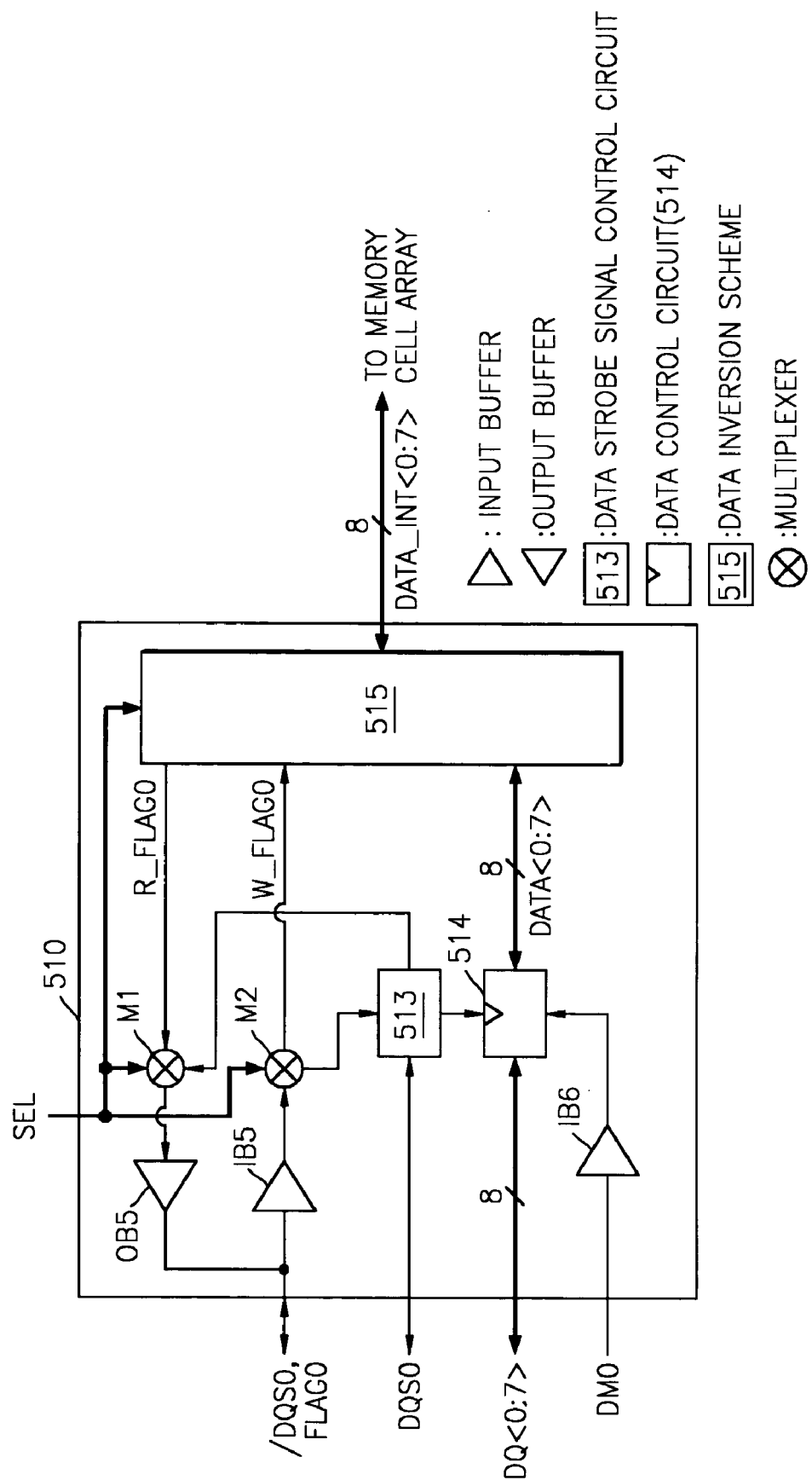
FIG. 17 shows a block diagram of a first embodiment of a data processing circuit according to one or more aspects of the present invention.

FIG. 17 shows a block diagram of a first embodiment of the byte0 data processing circuit 510 of the memory device 500. The data processing circuits 520, 530, and 540 in FIG. 16 are configured similarly to data processing circuit 510. The data processing circuit 510 comprises a number of components, including data strobe signal control circuit 513, data control circuit 514, and the data inversion block 515. Data strobe signal control circuit 513 generates the read data strobe signal DQS0. Data control circuit 514 controls data input/output during both data read and data write operations. DM0 masks write data for byte0 during a data write operation. Data inversion block 515 performs a data inversion process during read and write operations according to the flags R_FLAG0 and W_FLAG0 flags, when the memory device 500 operates in the first (single DQS) data strobe mode with data inversion, according to the SM/DM mode selection signal SEL signal. In response to the SM/DM mode selection signal SEL, multiplexers M1 and M2 switch the /DQS0,FLAG0 data strobe signal between functioning as a data inversion flag in the first (single DQS) data strobe mode with data inversion, and a differential data strobe signal in the second (differential DQS) data strobe mode without data inversion. In the first (single DQS) data strobe mode with data inversion, the /DQS0,FLAG0 signal functions as both the read and write data inversion flags.

Figure 18:
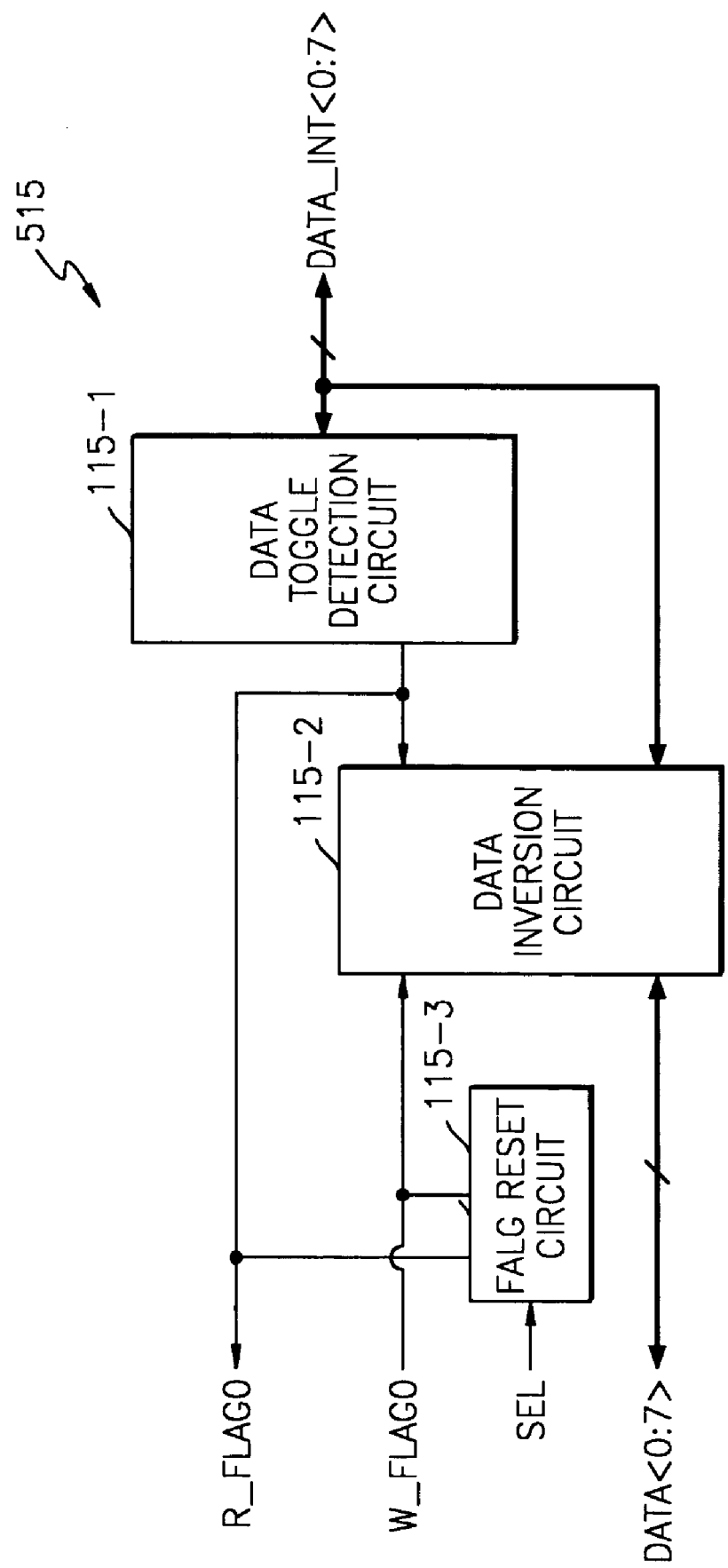
FIG. 18 shows an embodiment of the data inversion block according to one or more aspects of the present invention.

FIG. 18 shows an embodiment of the data inversion block 515. The data inversion block 115 includes data toggle detection circuit 115-1, data inversion circuit 115-2, and flag rest circuit 515-3. Data toggle detection circuit 115-1 detects whether the read data input from a memory cell array are inverted or not, and then outputs the read data inversion flag R_FLAG0 having the corresponding logic state. Data inversion circuit 115-2 inverts the data being written to, or read from, the memory cell array according to the logical state of the write data inversion flag W_FLAG0 in a data write mode, or the R_FLAG0 in a data read mode.

Flag reset circuit 515-3 resets the flags R_FLAG0 and W_FLAG0 (e.g., to a logical low state) when the SM/DM mode selection signal SEL indicates that the memory device 500 should operate in the second (differential DQS) data strobe mode (e.g., SEL has a logical low state). In this case, a logical low state indicates a mode with no data inversion.

Figure 19:
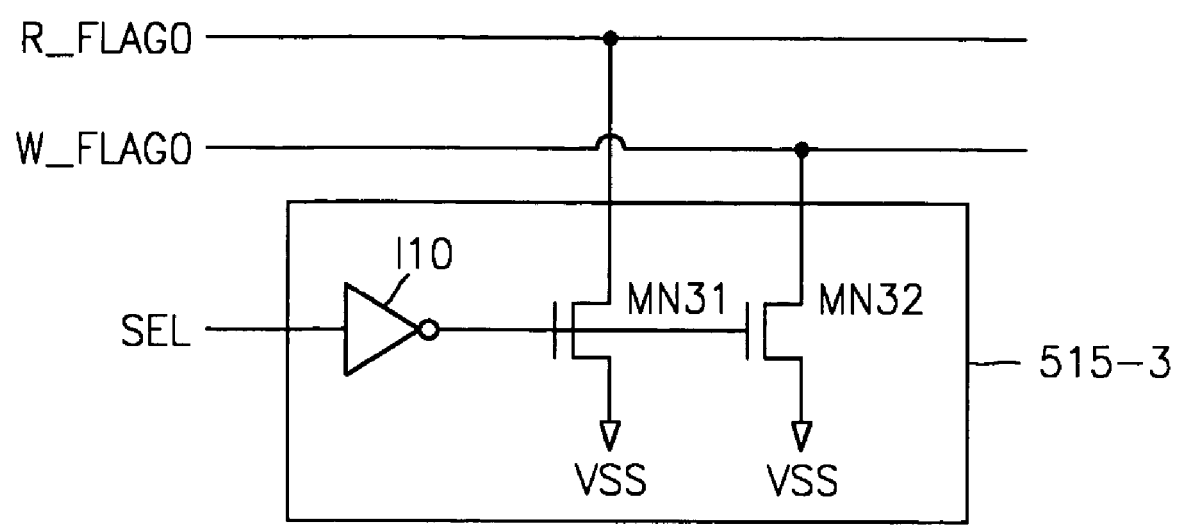
FIG. 19 shows an embodiment of a flag reset circuit.

FIG. 19 shows an embodiment of the flag reset circuit 515-3. As can be easily understood from the drawing, in the embodiment of FIG. 19, whenever the SM/DM mode selection signal SEL signal goes low indicating that the memory device 500 should operate in the second (differential DQS) data strobe mode without data inversion, then the R_FLAG0 and W_FLAG0 signals are also pulled to a logical low state.

Figure 20:
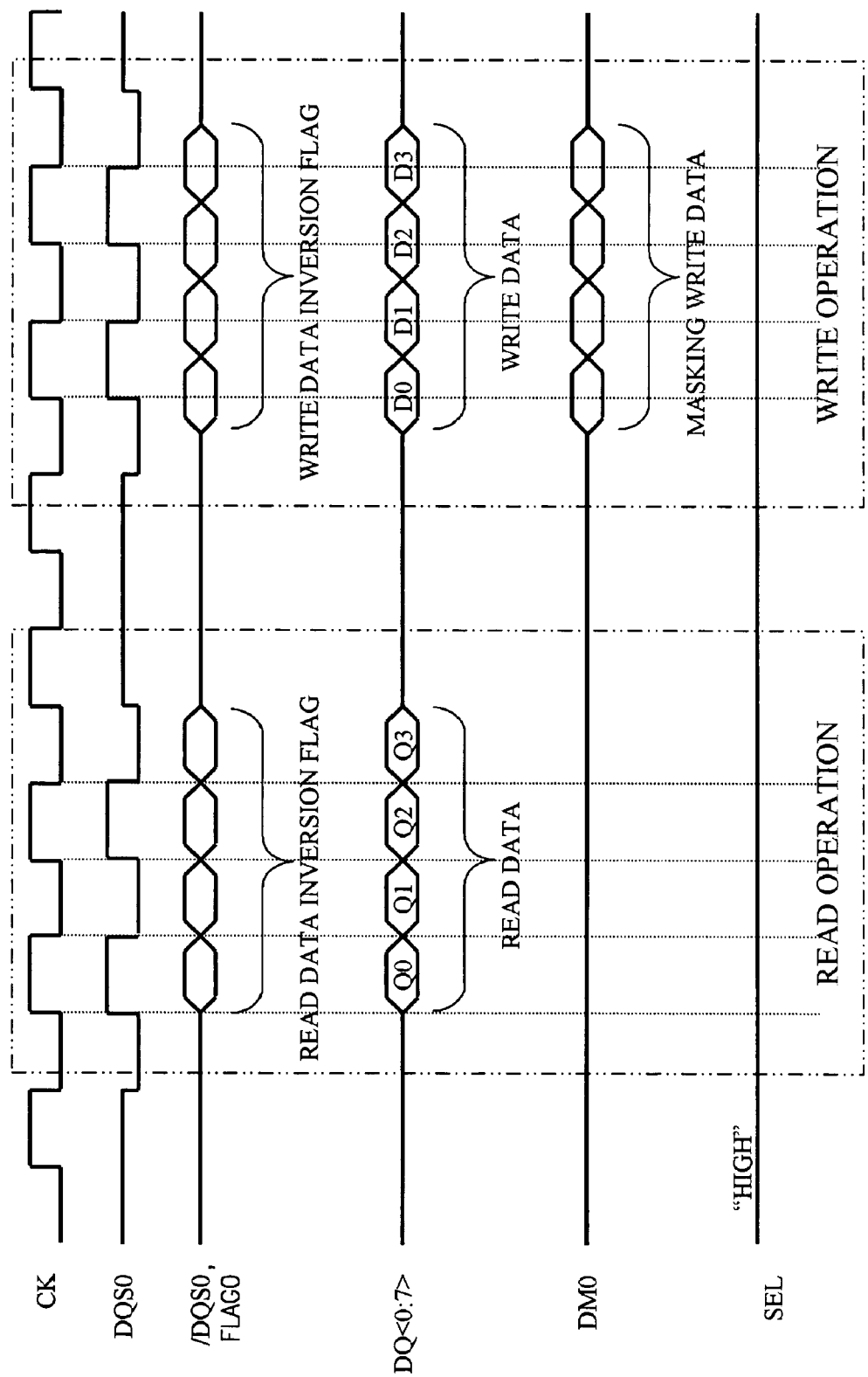
FIG. 20 shows a first case of a timing diagram according to one or more aspects of the present invention.

FIG. 20 shows a first case of a timing diagram of a memory device such as the memory device 500 of FIG. 16. The timing diagram of FIG. 20 pertains to the case where the memory device operates in the first (single DQS) data strobe mode with data inversion. In that case, the SM/DM mode selection signal SEL has a logical high state. In this mode, the signal DQS<0:3> functions as the single data strobe for both the data read and data write operations. Meanwhile, the signal /DQS<0:3> functions as read/write data inversion flags during the data read and data write operations. As can be seen from FIG. 20, read data (Q0, Q1, Q2, and Q3) are output from the memory device in sync with the rising edge of DSQ0. Meanwhile, write data (D0, D1, D2, and D3) are input to the memory device in sync with the center of the DQS0 pulses (center strobing).

Figure 21:
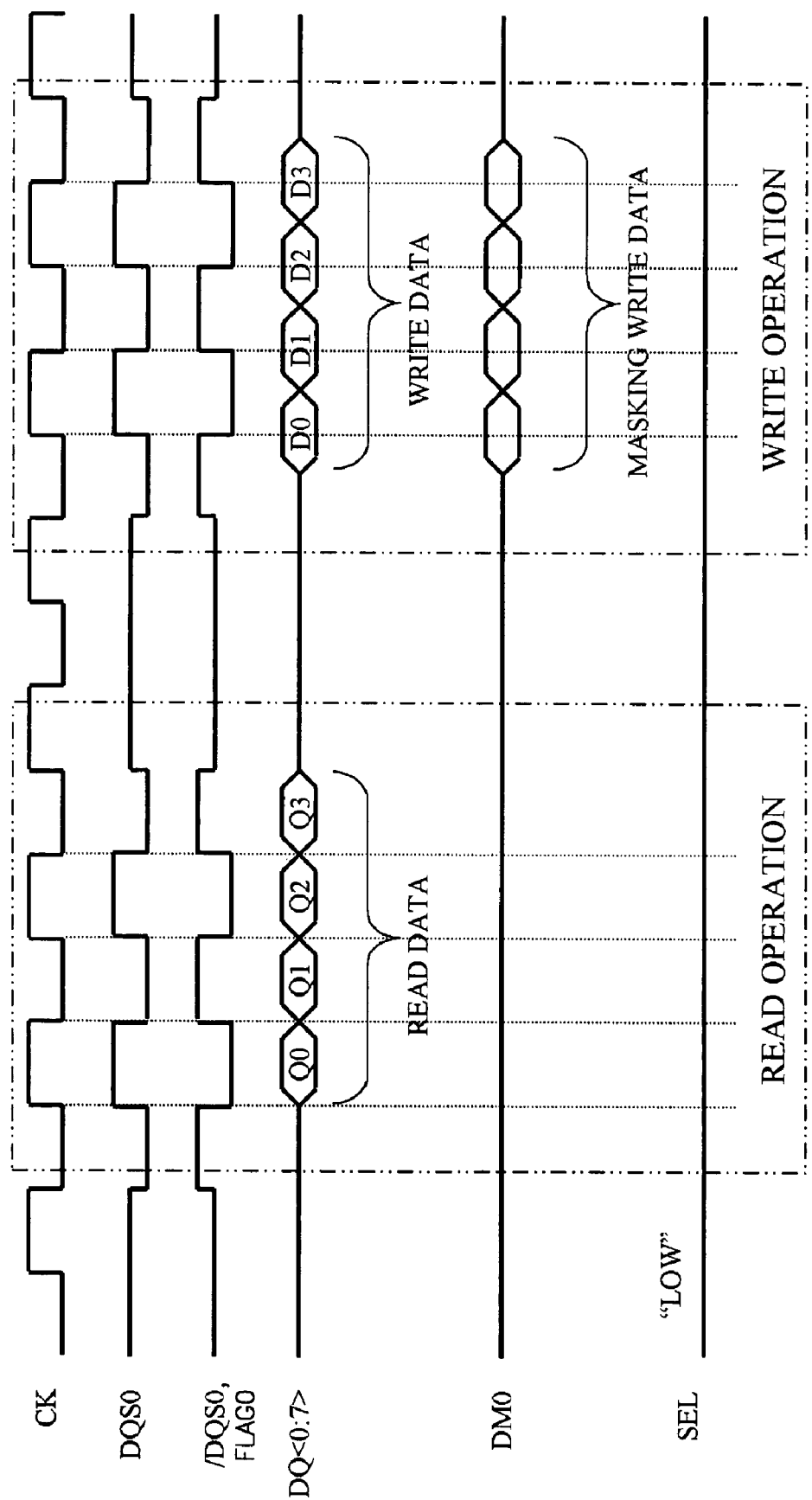
FIG. 21 shows a second case of a timing diagram according to one or more aspects of the present invention.

FIG. 21 shows a second case of a timing diagram of a memory device such as the memory device 500 of FIG. 16. The timing diagram of FIG. 21 pertains to the case where the memory device operates in the second (differential DQS) data strobe mode without data inversion. In that case, the SM/DM mode selection signal SEL has a logical low state. In this mode, the signals DQS<0:3> and /DQS<0:3> function as dual, or differential, data strobes for both the data read and data write operations. As can be seen from FIG. 21, read data (Q0, Q1, Q2, and Q3) are output from the memory device in sync with the rising edge of DSQ0 and /DQS0. Meanwhile, write data (D0, D1, D2, and D3) are input to the memory device in sync with the center of the DQS0 and /DQS0 pulses (center strobing).

Figure 22:
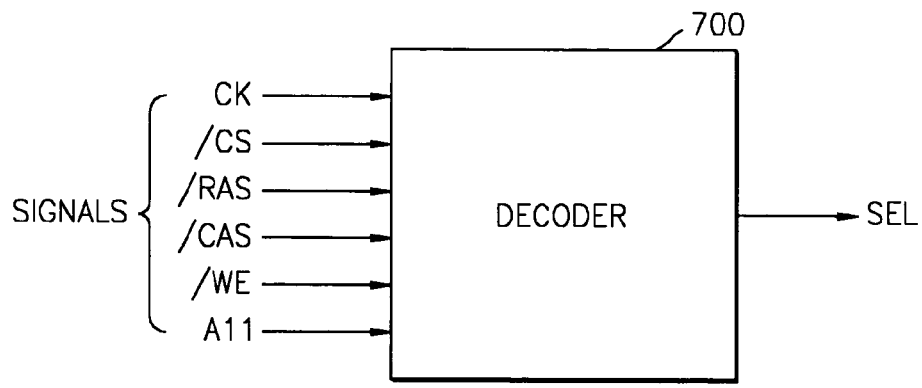
FIG. 22 shows a first embodiment of an SM/DM mode selection signal generator.

FIG. 22 shows a first embodiment of the SM/DM mode selection signal generator 700. A memory device operates with a mode register set (MRS) command that is coded as a mode register address by the various logical values of a combination of certain input signals. The mode register stores data for controlling various operating modes of the memory device. For example, the mode register can set the CAS latency (CL), the column addressing mode (e.g., burst type: BT), the burst length (BL), a test mode (TM), and various other options of the memory device. A default value may or may not be defined for the mode register.

In the embodiment of FIG. 22, the MRS command is asserted by asserting logical low values on the /CS, /RAS, /CAS, /WE lines. Accompanying address lines can code a plurality of modes. The mode register contents can be changed as long as the memory device is in an idle state. In the embodiment of FIG. 22, the SM/DM mode selection signal generator 700 comprises a decoder that receives the MRS command for the memory device and outputs the SM/DM mode selection signal SEL. More particularly, the mode selection signal generator 700 decodes the MRS command from the logical state of each of a plurality of input signals, and generates therefrom the SM/DM mode selection signal SEL.

Figure 23:
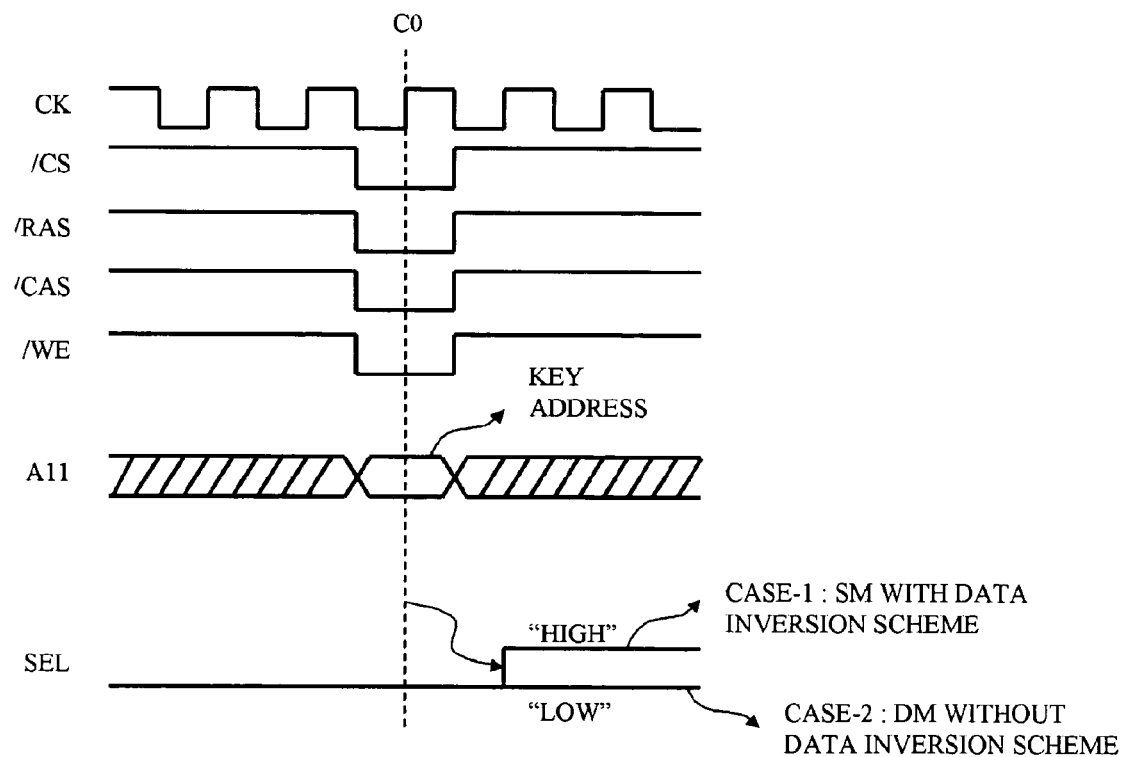
FIG. 23 shows a timing diagram of the first embodiment of the mode selection signal generator.

FIG. 23 shows a timing diagram of the first embodiment of the mode selection signal generator 700.

Figure 24:
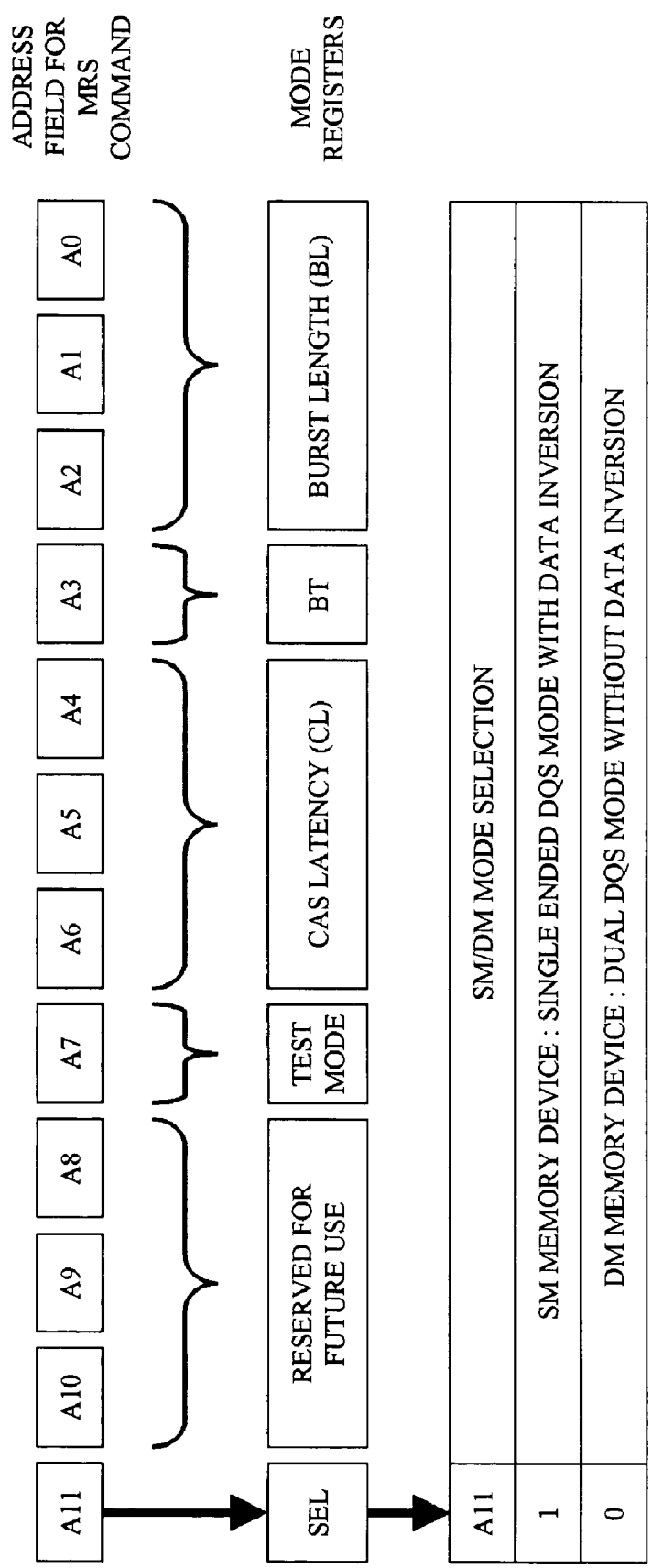
FIG. 24 shows a mode register set (MRS) table according to one or more aspects of the present invention.

FIG. 24 shows a mode register set (MRS) table. As shown in FIG. 24, the MRS table is divided into various fields corresponding to different register addresses according to functionality. For example, the burst length BL uses A0-A2, column addressing mode BT uses A3, CAS latency CL uses A4-A6, testing mode uses A7, etc. In the embodiment of FIG. 24, the SM/DM mode selection signal SEL uses the register address A11. When the data stored at register address A11 is a 1, then the memory device operates as an SM memory device, i.e., in the first (single ended DQS) data strobe mode with data inversion. When the data stored at register address A11 is a 0, then the memory device operates as a DM memory device, i.e., in the second (dual DQS) data strobe mode without data inversion.

According to the first embodiment described above, a memory device may operate in a first (single DQS) data strobe mode with data inversion, or in a second (differential DQS) data strobe mode without data inversion, according to a received MRS command. Accordingly, no additional balls or pins on the memory device are required to provide the mode selection.

Figure 1:
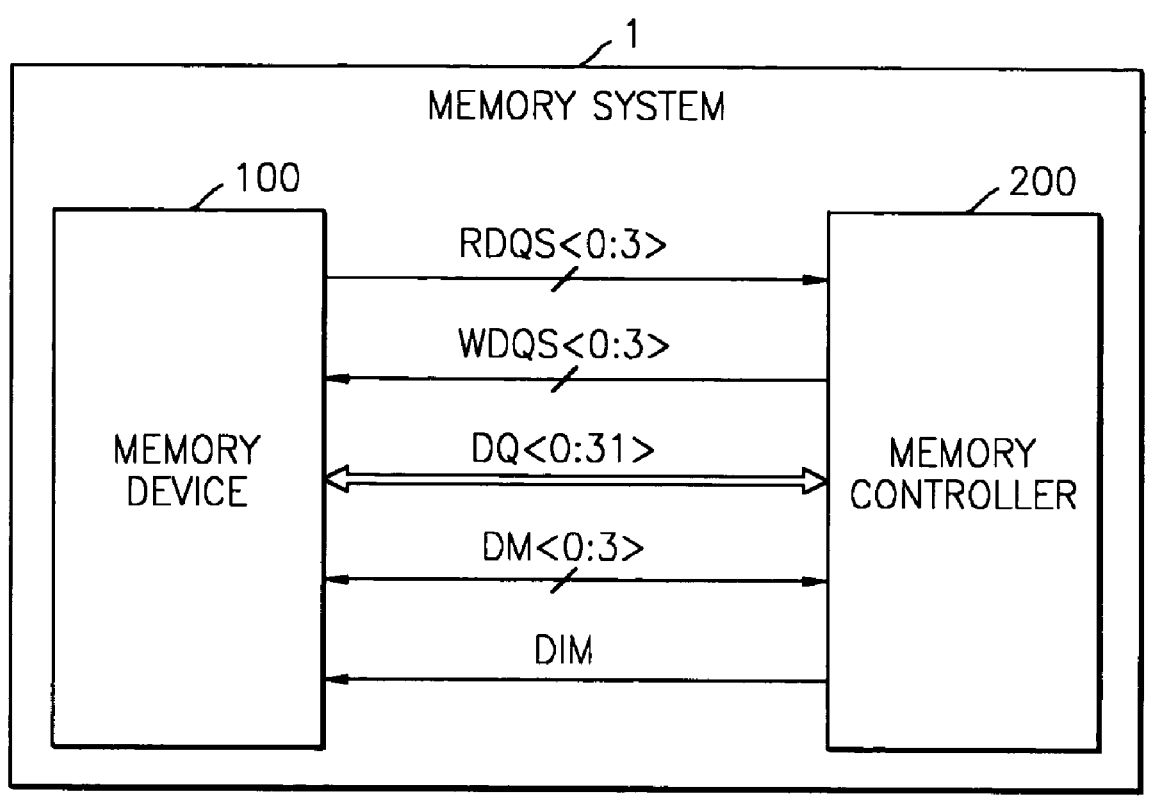
FIG. 1 is a block diagram of a memory system with a single DQS memory device.
Figure 2:
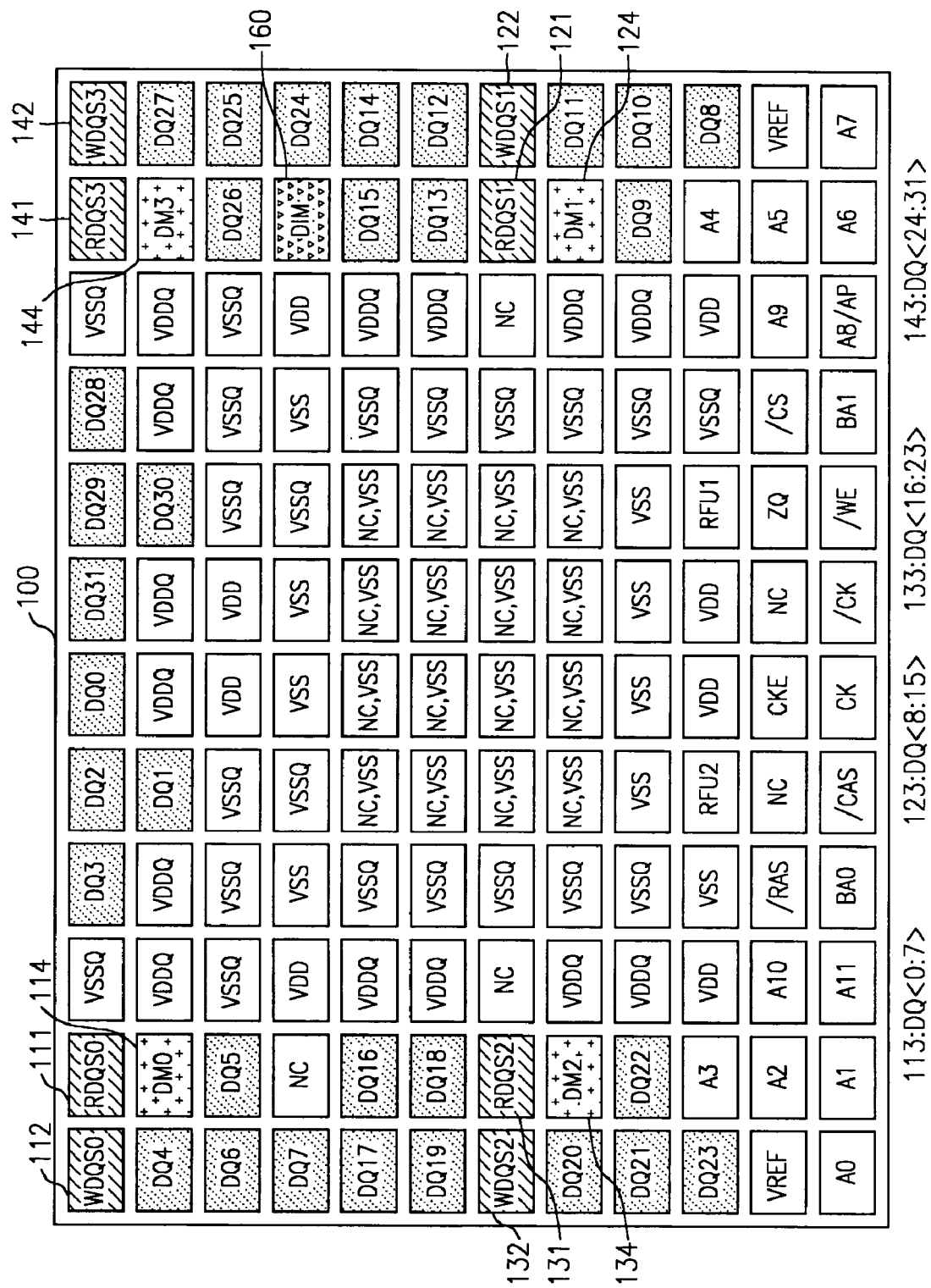
FIG. 2 shows a ball (or pin) configuration of a conventional single DQS mode memory device.
Figure 3:
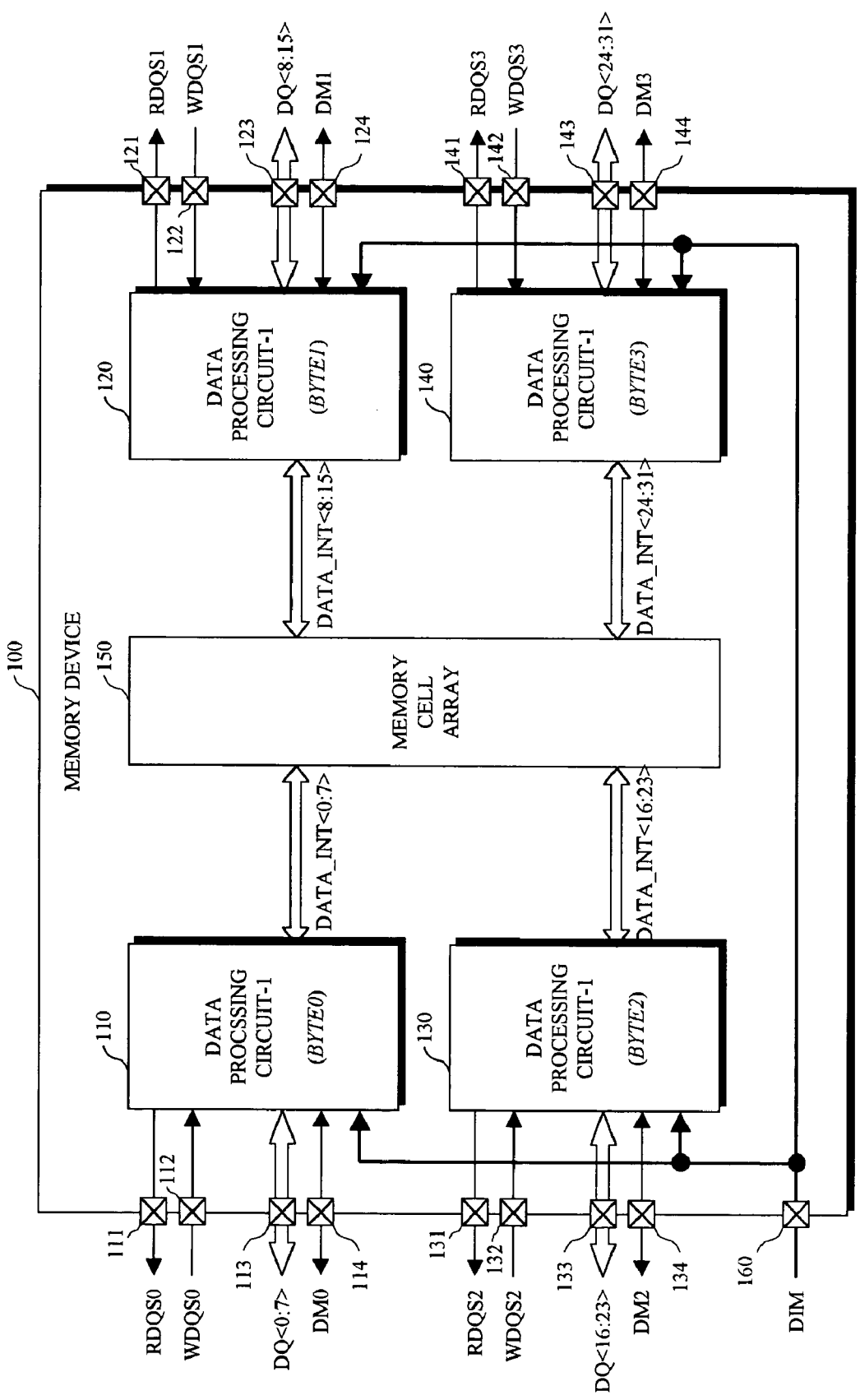
FIG. 3 shows a data processing block diagram of a conventional single DQS mode memory device.
Figure 4:
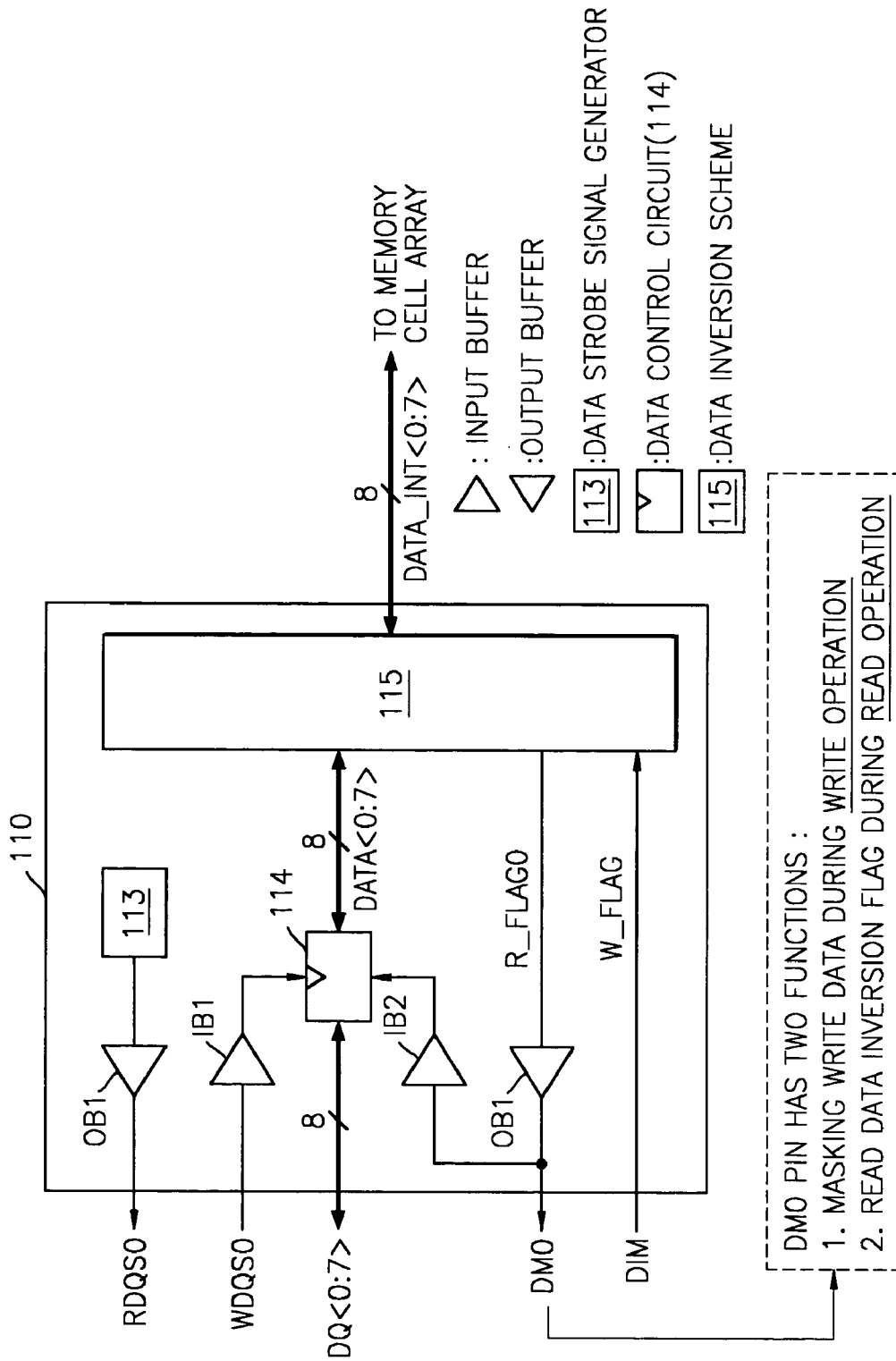
FIG. 4 shows a conventional block diagram of a conventional byte0 data processing circuit.
Figure 5:
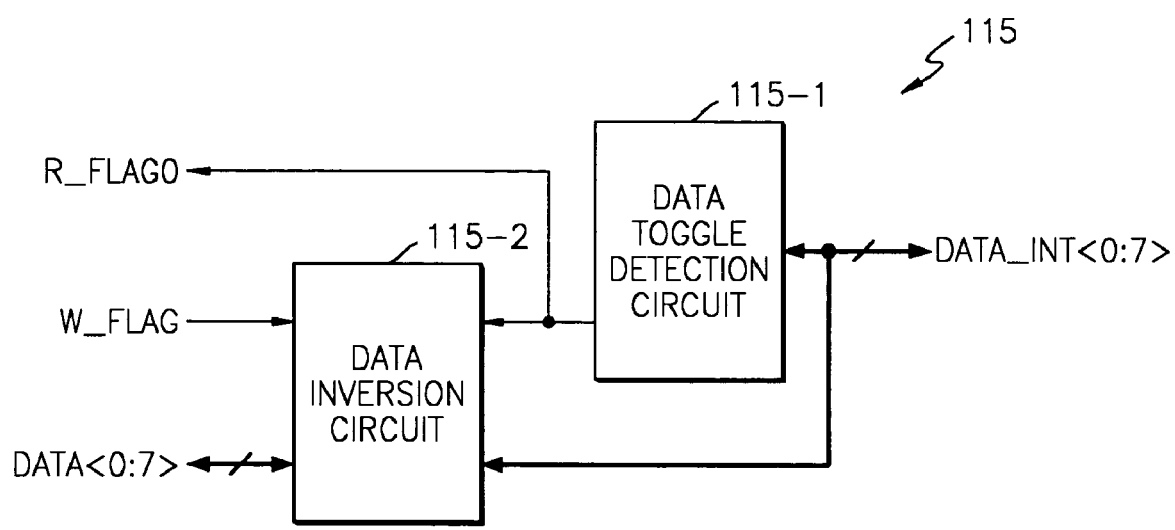
FIG. 5 shows a conventional data inversion circuit.
Figure 6:
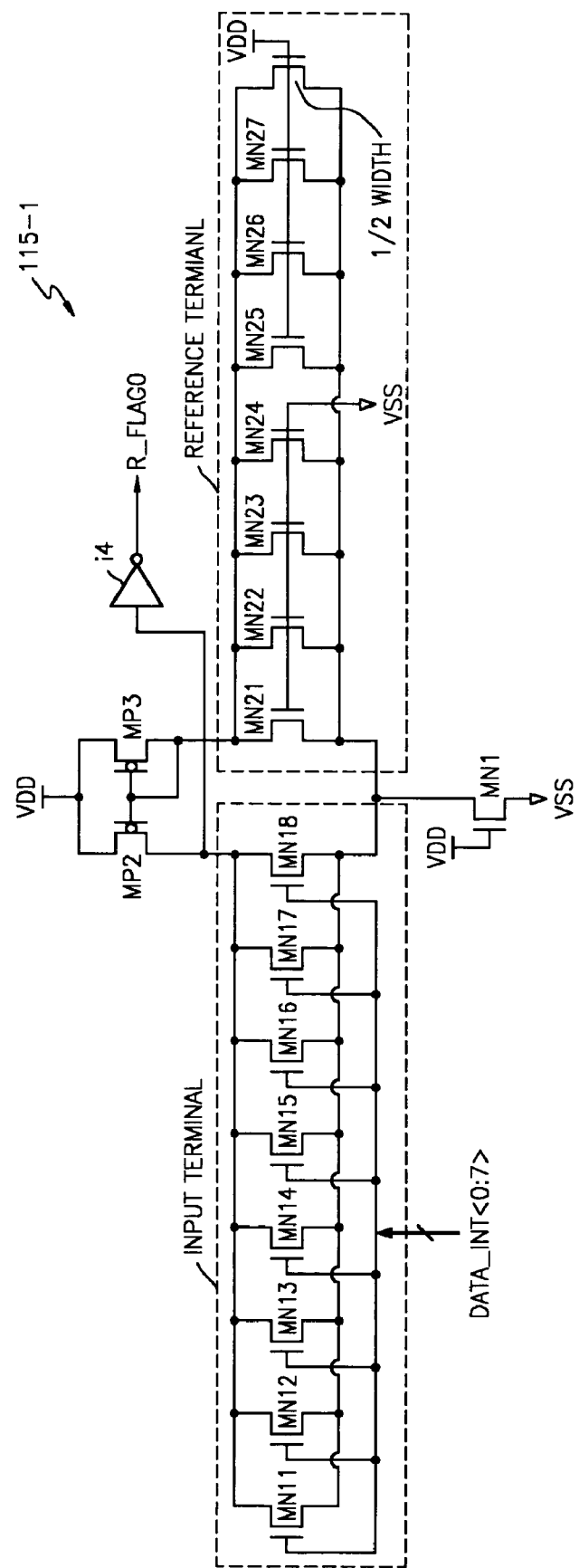
FIG. 6 shows a conventional data toggle detection circuit.
Figure 7:
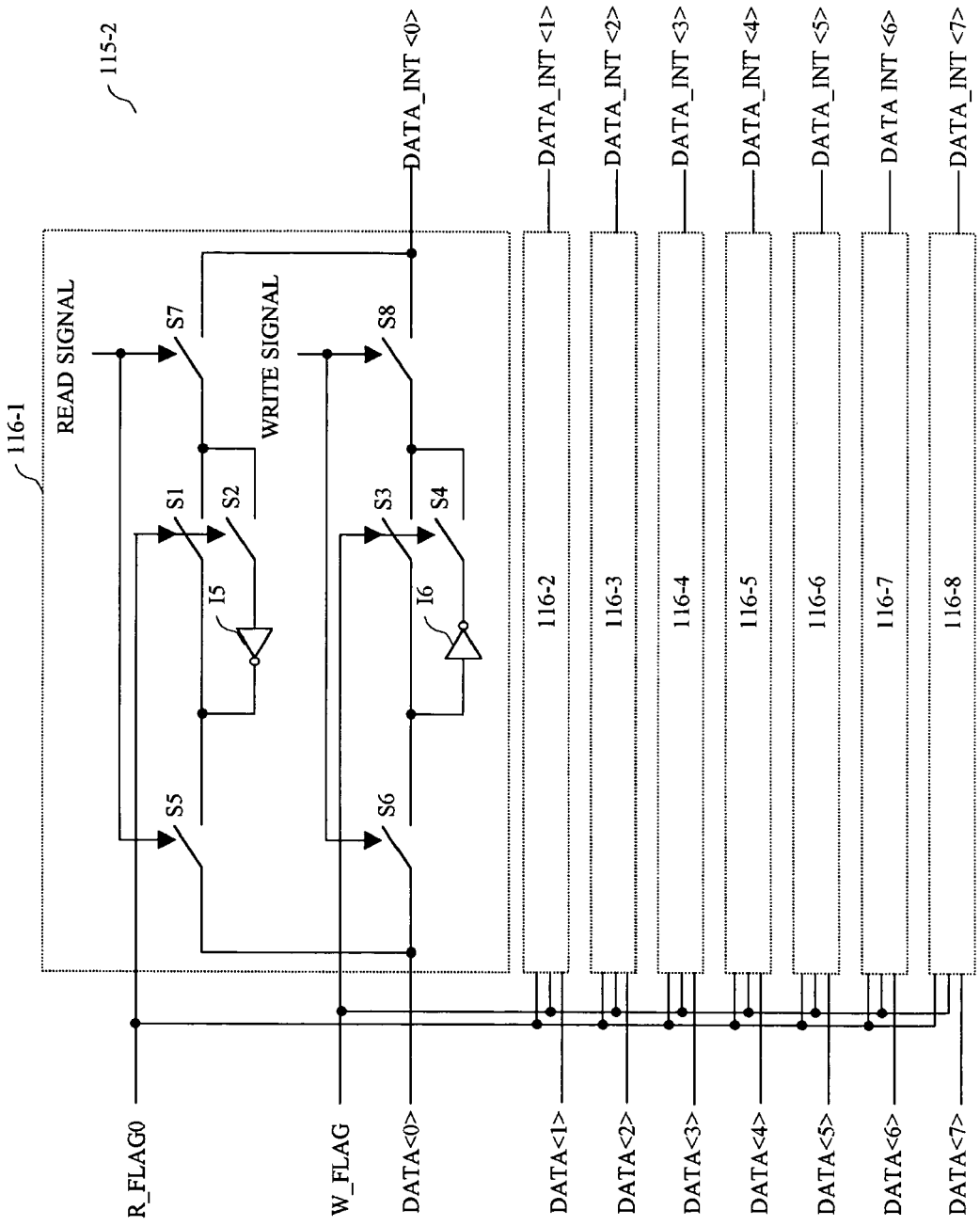
FIG. 7 shows a conventional data inversion block.
Figure 8:
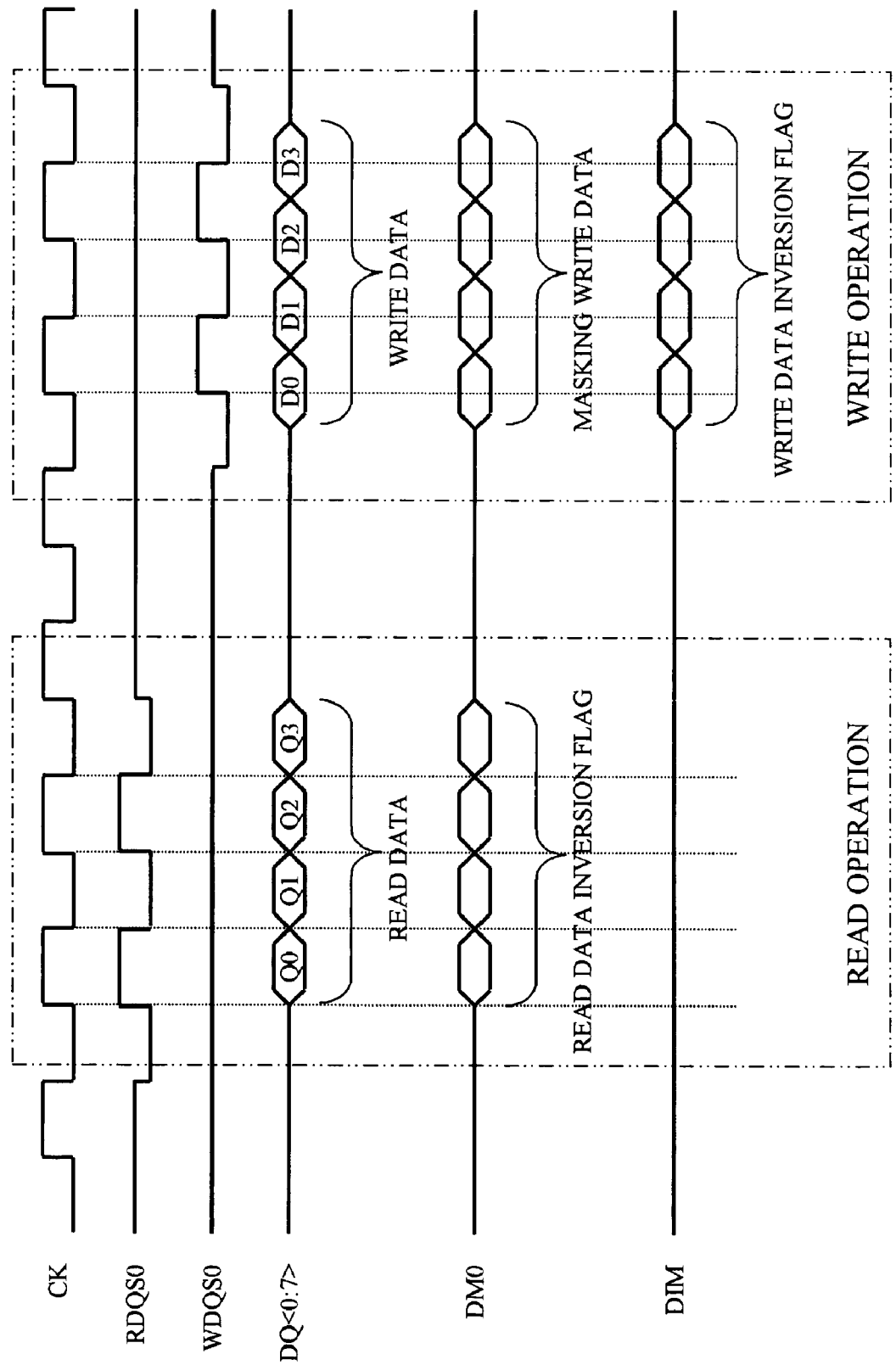
FIG. 8 shows a timing diagram of a single DQS mode memory device with a data inversion circuit.
Figure 9:
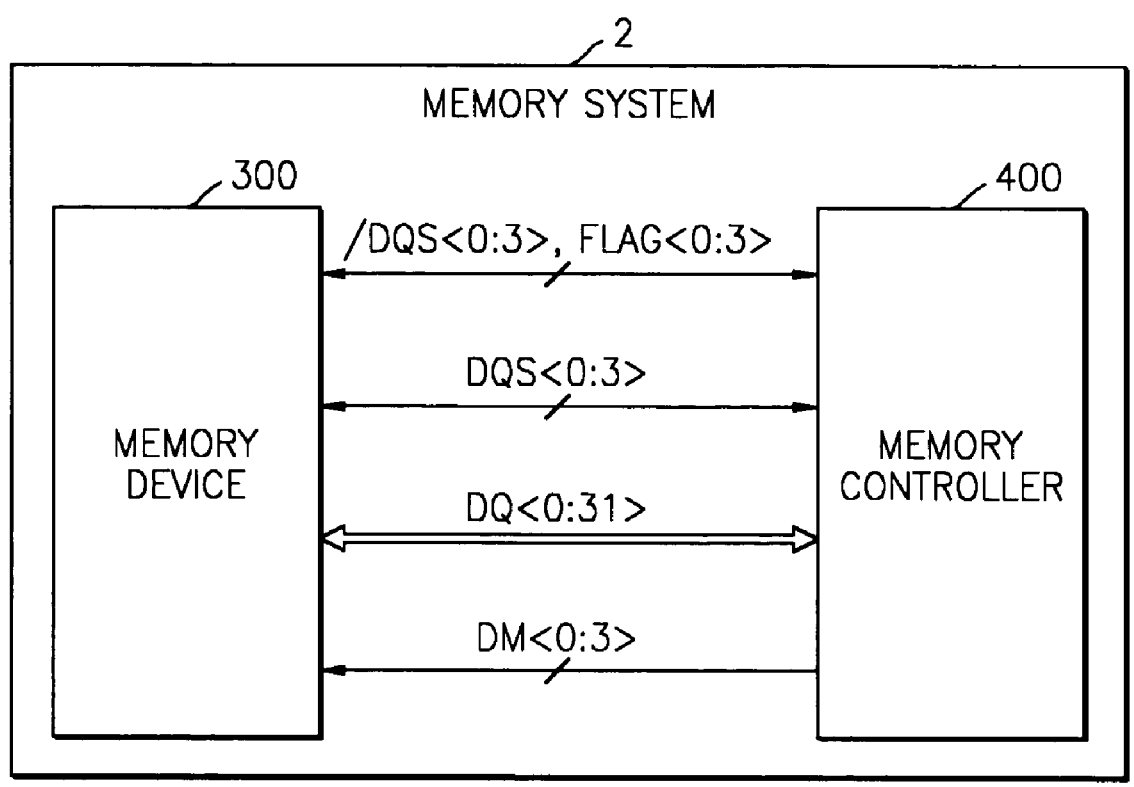
FIG. 9 shows a block diagram of a conventional memory system with a differential DQS mode memory device.
Figure 11:
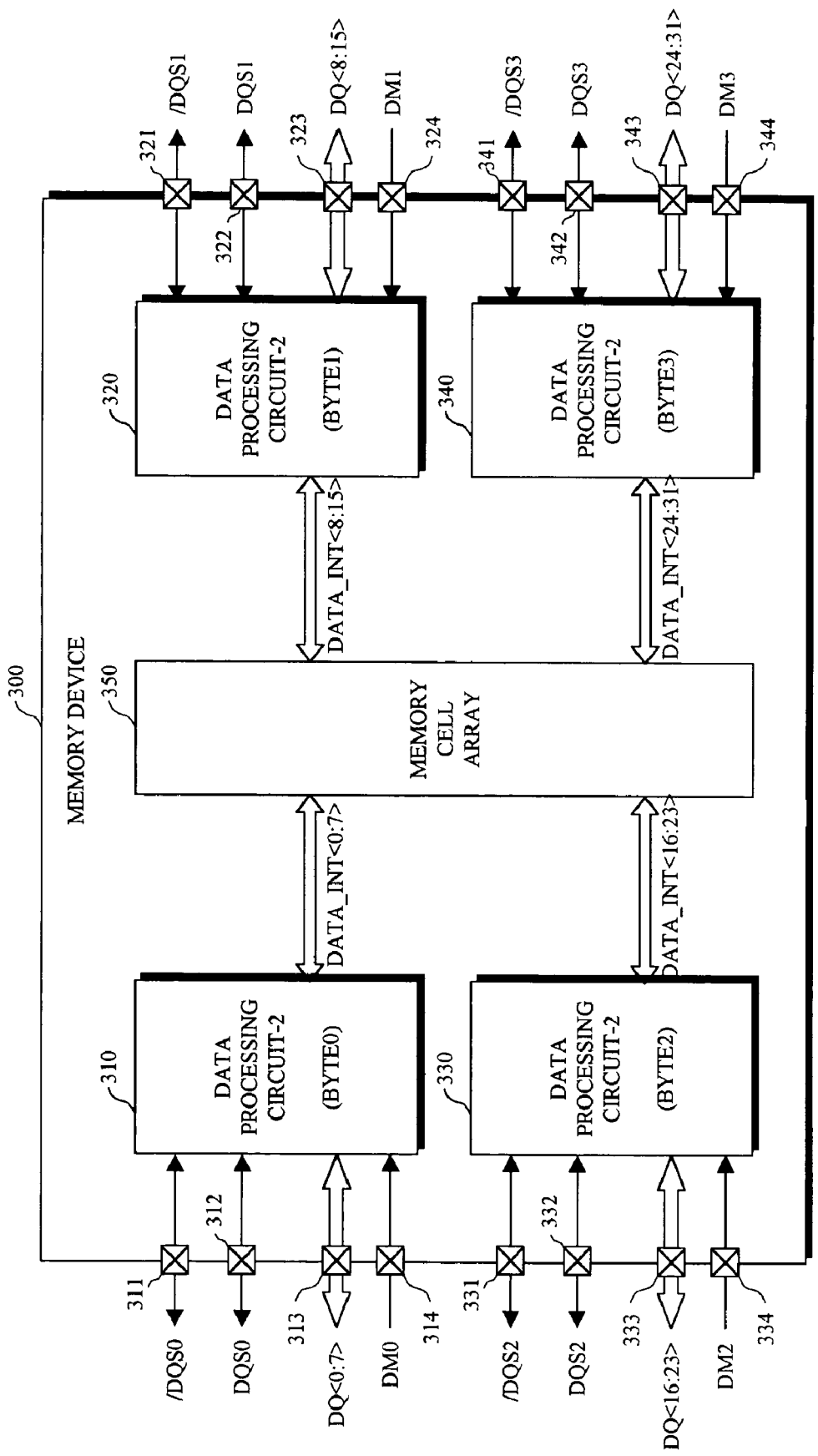
FIG. 11 shows a data processing block diagram of a conventional differential DQS mode memory device.
Figure 12:
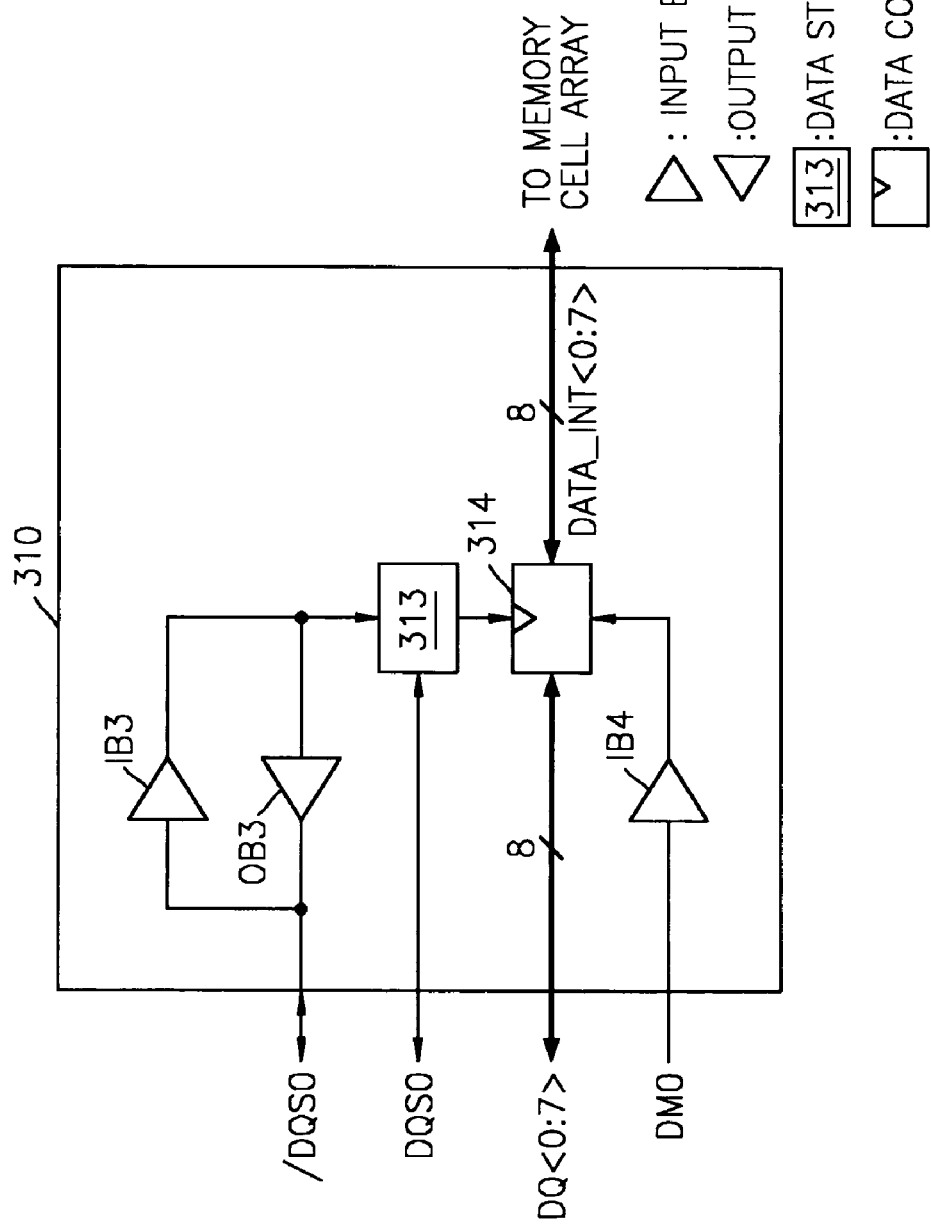
FIG. 12 shows a block diagram of a conventional byte0 data processing circuit.
Figure 13:
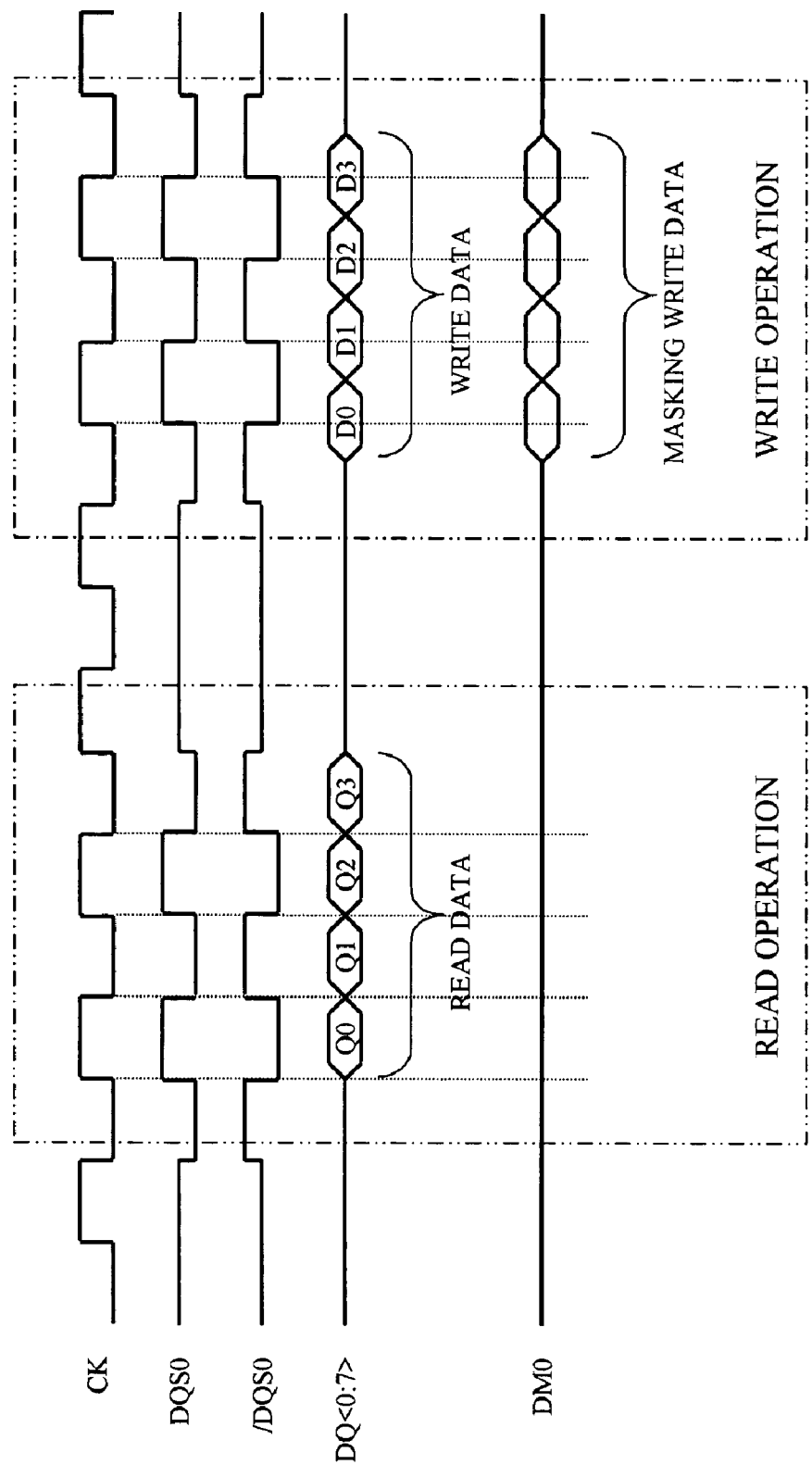
FIG. 13 shows a timing diagram of a differential DQS mode memory device without a data inversion circuit.

Table 1 below compares the function of various input/outputs for the memory device 500 of FIGS. 14 and 17, with those of the memory device 100 of FIGS. 1 and 3, and memory device 300 of FIGS. 9 and 11.

TABLE 1

| Input/Output Pins | READ OPERATION | | | | WRITE OPERATION | | | |
| --- | --- | --- | --- | --- | --- | --- | --- | --- |
| | 100 (Single Mode) | 300 (Dual Mode) | 500 Single Mode | 500 Dual Mode | 100 (Single Mode) | 300 (Dual Mode) | 500 Single Mode | 500 Dual Mode |
| DM<0:3> | Read Data Inversion Flag | — | — | — | Write Data Masking | Write Data Masking | Write Data Masking | Write Data Masking |
| DIM | — | | | | Write Data Inversion Flag | | | |
| RDQS<0:3> | Data Strobe | | | | — | | | |
| WDQS<0:3> | — | | | | Data Strobe | | | |
| DQS<0:3> | | Data | Data | Data | | Data | Data | Data |

TABLE 1-continued

| Input/Output Pins | READ OPERATION | | | | WRITE OPERATION | | | |
|---|---|---|---|---|---|---|---|---|
| | 100 (Single Mode) | 300 (Dual Mode) | 500 Single Mode | 500 Dual Mode | 100 (Single Mode) | 300 (Dual Mode) | 500 Single Mode | 500 Dual Mode |
| /DQS<0:3> | | Strobe Data Strobe | Strobe Read Data Inversion Flag | Strobe Data Strobe | | Strobe Data Strobe | Strobe Write Data Inversion Flag | Strobe Data Strobe |

Beneficially, because the memory device 500 operates with four write data inversion flags (/DQS<0:3>) when in the second (differential DQS) data strobe mode, write inversion can be individually performed on a data byte by byte basis. This is in contrast to the memory device 100 of FIG. 3.

Figure 25:
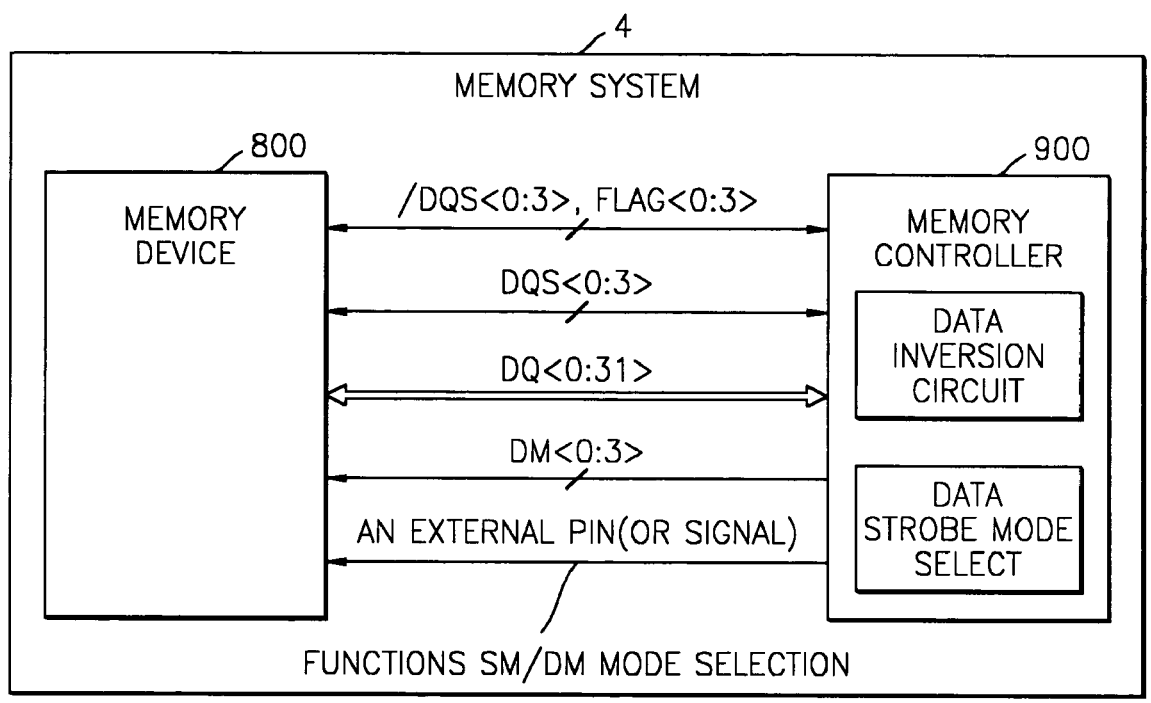
FIG. 25 shows a block diagram of a second embodiment of a memory system according to one or more aspects of the present invention.

FIG. 25 shows a block diagram of a second embodiment of a memory system. According to one or more aspects of the present invention, the memory system 4 includes a memory device 800 and a memory controller 900. The memory device 800 can operate in a first (single DQS) data strobe mode with data inversion, or in a second (differential DQS) data strobe mode without data inversion. The memory controller 900 includes a data inversion circuit and data strobe mode changing means In the memory system 4, the memory device 800 includes a dedicated external ball or pin to receive an SM/DM mode selection signal SEL. Beneficially, the SM/DM mode selection signal SEL is provided to the external ball or pin from the data strobe mode changing means of the memory controller 900. An otherwise unconnected (NC) or unused external ball or pin of the memory device 800 can be used for the SM/DM mode selection signal SEL.

Figure 26:
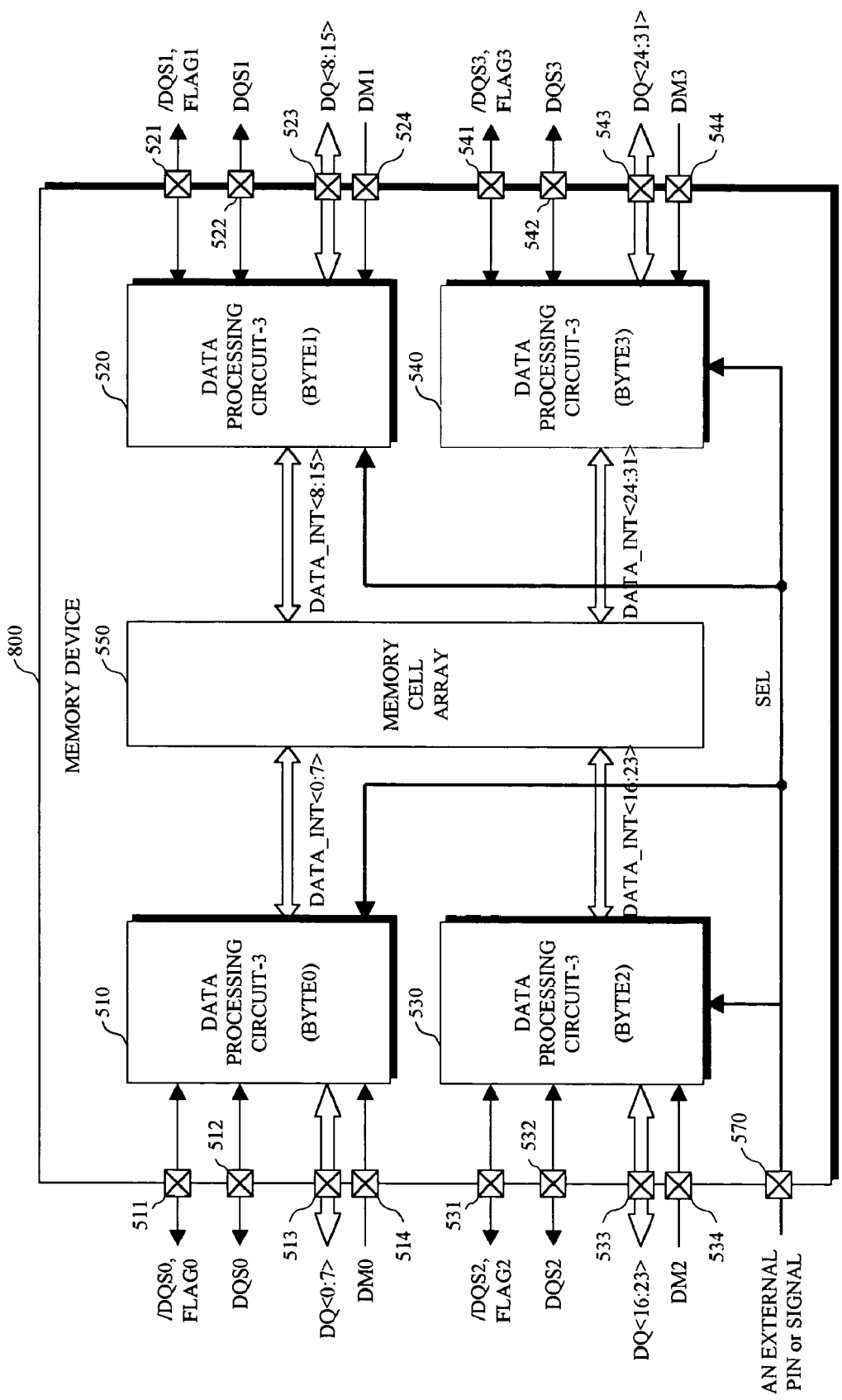
FIG. 26 shows a data processing block diagram of a second embodiment of a memory device according to one or more aspects of the present invention.

FIG. 26 shows a data processing block diagram of a second embodiment of a memory device 800. FIG. 26 is similar to the data processing diagram of the memory device 500 as shown in FIG. 16, except that instead of receiving the MRS command at the input 560, the memory device 800 receives the SM/DM mode selection signal SEL directly through an external ball or pin 570.

Figure 27:
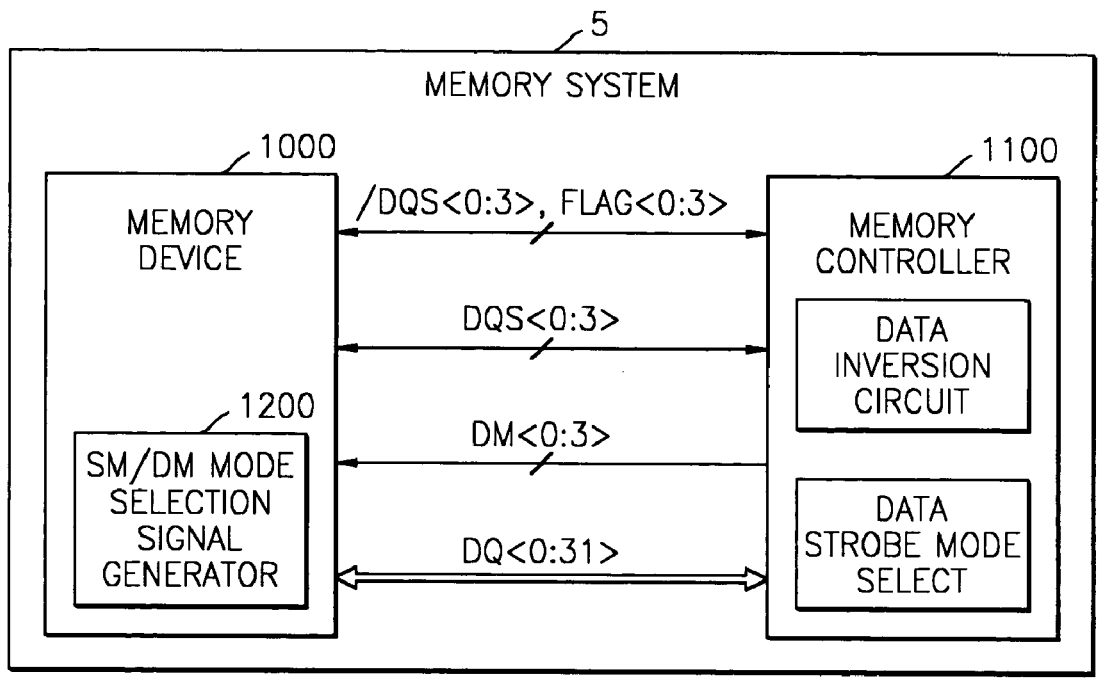
FIG. 27 shows a block diagram of a third embodiment of a memory system according to one or more aspects of the present invention.

FIG. 27 shows a third embodiment of a block diagram of a memory system 5. The memory system 5 includes a memory device 1000 and a memory controller 1100. The memory device 1000 can operate in a first (single DQS) data strobe mode with data inversion, or in a second (differential DQS) data strobe mode without data inversion.

In the memory system 5, the memory device 1000 generates SM/DM mode selection signal SEL. To this end, the memory device 1000 includes an SM/DM mode selection signal generator 1200.

Figure 28:
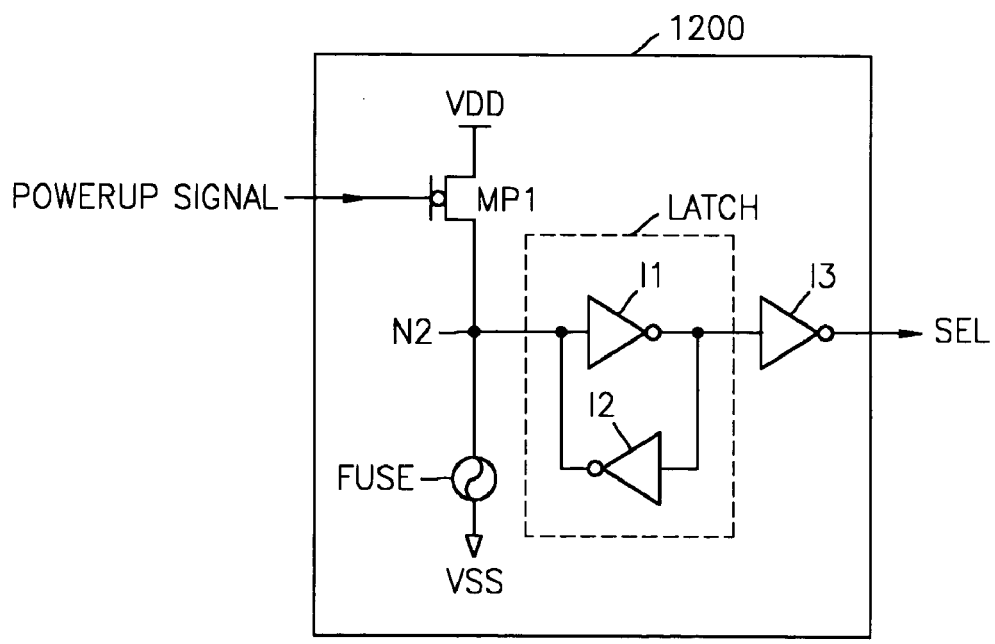
FIG. 28 shows a second embodiment of an SM/DM mode selection signal generator.

FIG. 28 shows a second embodiment of an SM/DM mode selection signal generator, which is in turn a first embodiment of the SM/DM mode selection signal generator 1200 of FIG. 27. The SM/DM mode selection signal generator 1200 of FIG. 28 is a fuse signal generator that outputs a mode selection signal whose logical value depends upon whether or not the fuse was cut. During the power-up sequence for the memory device 1000, the power-up signal starts from a low voltage level and gradually transitions to a high voltage level. If the fuse is cut (e.g., during a wafer fabrication stage), then the node N2 is charged up to the high voltage level VDD and the SM/DM mode selection signal SEL has a logical high value. On the other hand, if the fuse is not cut, then the node N2 is held to ground by the fuse and the SM/DM mode selection signal SEL has a logical low value.

Figure 29:
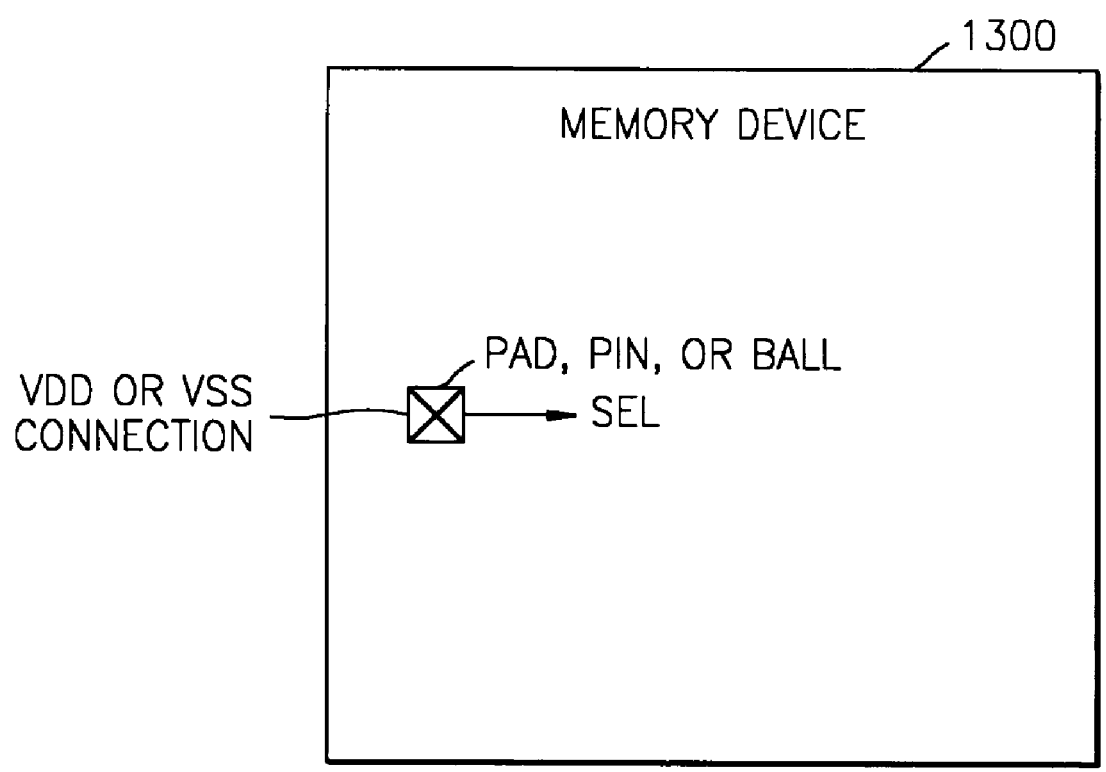
FIG. 29 shows a third embodiment of an SM/DM mode selection signal generator.

FIG. 29 shows a third embodiment of an SM/DM mode selection signal generator, which is in turn a second embodiment of the SM/DM mode selection signal generator 1200 of FIG. 27. In the embodiment of FIG. 29, the logical value of the mode selection signal is determined by connecting a ball, pin, or pad of the memory device to a fixed voltage level. Beneficially, in the case of the ball or pin, a dedicated SEL ball or pin is connected to either VDD (logical high) or VSS (logical low) through a connection on the circuit board on which the memory device is mounted. Also beneficially, in the case of the pad, a dedicated pad on a semiconductor wafer is connected to either VDD (logical high) or VSS (logical low) by a bond wire before encapsulation.

Figure 30:
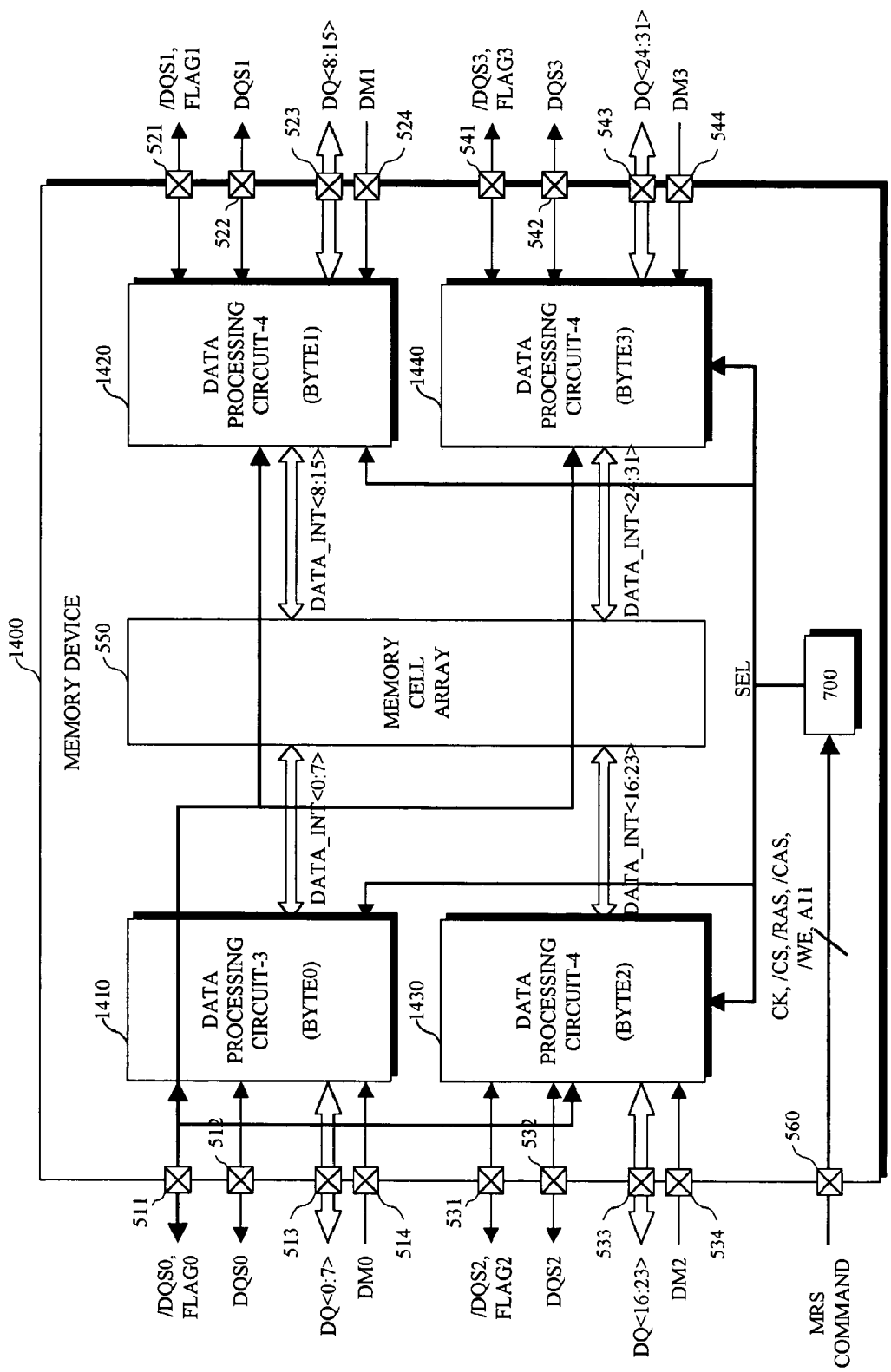
FIG. 30 shows a data processing block diagram of a third embodiment of a memory device according to one or more aspects of the present invention.

FIG. 30 shows a data processing block diagram of a third embodiment of a memory device. FIG. 30 is similar to the data processing block diagram of the memory device 500 as shown in FIG. 16, except that the byte0 data processing circuit 1410 generates the write data inversion flag W_FLAG for the other three data processing circuits 1420, 1430, and 1440.

Figure 31:
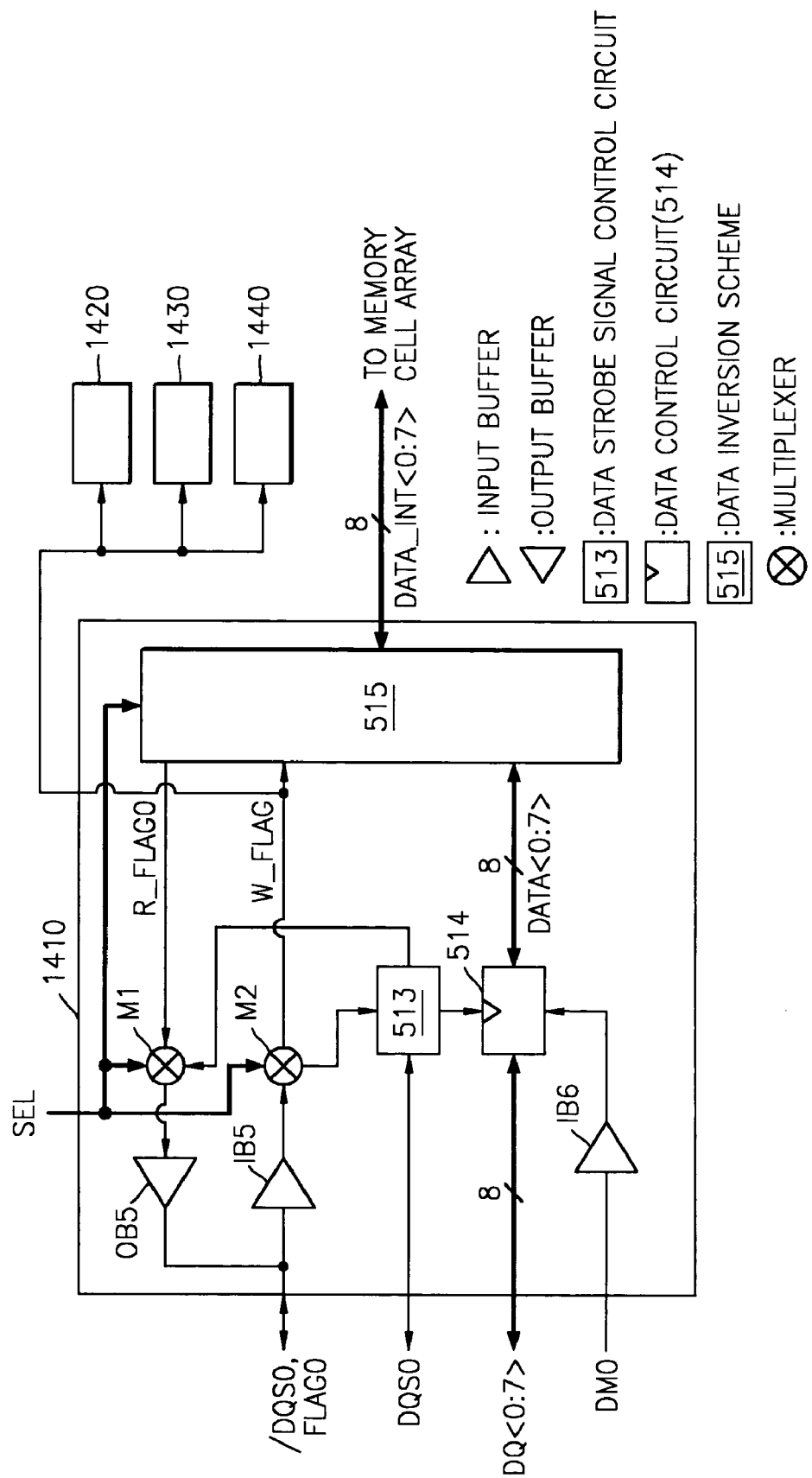
FIG. 31 shows a block diagram of a second embodiment of a data processing circuit according to one or more aspects of the present invention.

FIG. 31 shows a block diagram of a second embodiment of a byte0 data processing circuit 1410. The data processing circuits 1420, 1430, and 1440 in FIG. 30 are configured differently from the data processing circuit 1410, as will be explained in further detail below. The data processing circuit 1410 comprises a number of components, including data strobe signal control circuit 513, data control circuit 514, and the data inversion block 515. Data strobe signal control circuit 513 generates the read data strobe signal DQS0. Data control circuit 514 controls data input/output during both data read and data write operations. DM0 masks write data during a data write operation. Data inversion block 515 performs a data inversion process during read and write operations according to the flags R_FLAG0 and W_FLAG when the memory device 500 operates in the first (single DQS) data strobe mode with data inversion, in response to the SM/DM mode selection signal SEL signal. Multiplexers M1 and M2 switch the /DQS0,FLAG0 data strobe signal between functioning as a data inversion flag in the first (single DQS) data strobe mode with data inversion, and functioning as a differential data strobe signal in the second (differential DQS) data strobe mode without data inversion.

In the byte0 data processing circuit 1410, the multiplexer M2 receives the /DQS0,FLAG0 signal and, in response to the SM/DM mode selection signal SEL indicating the first (single DQS) data strobe mode with data inversion, generates a W_FLAG write data inversion flag for all four data processing circuits 1410, 1420, 1430, and 1440 processing all four bytes to be written into the memory cell array 550.

Figure 32:
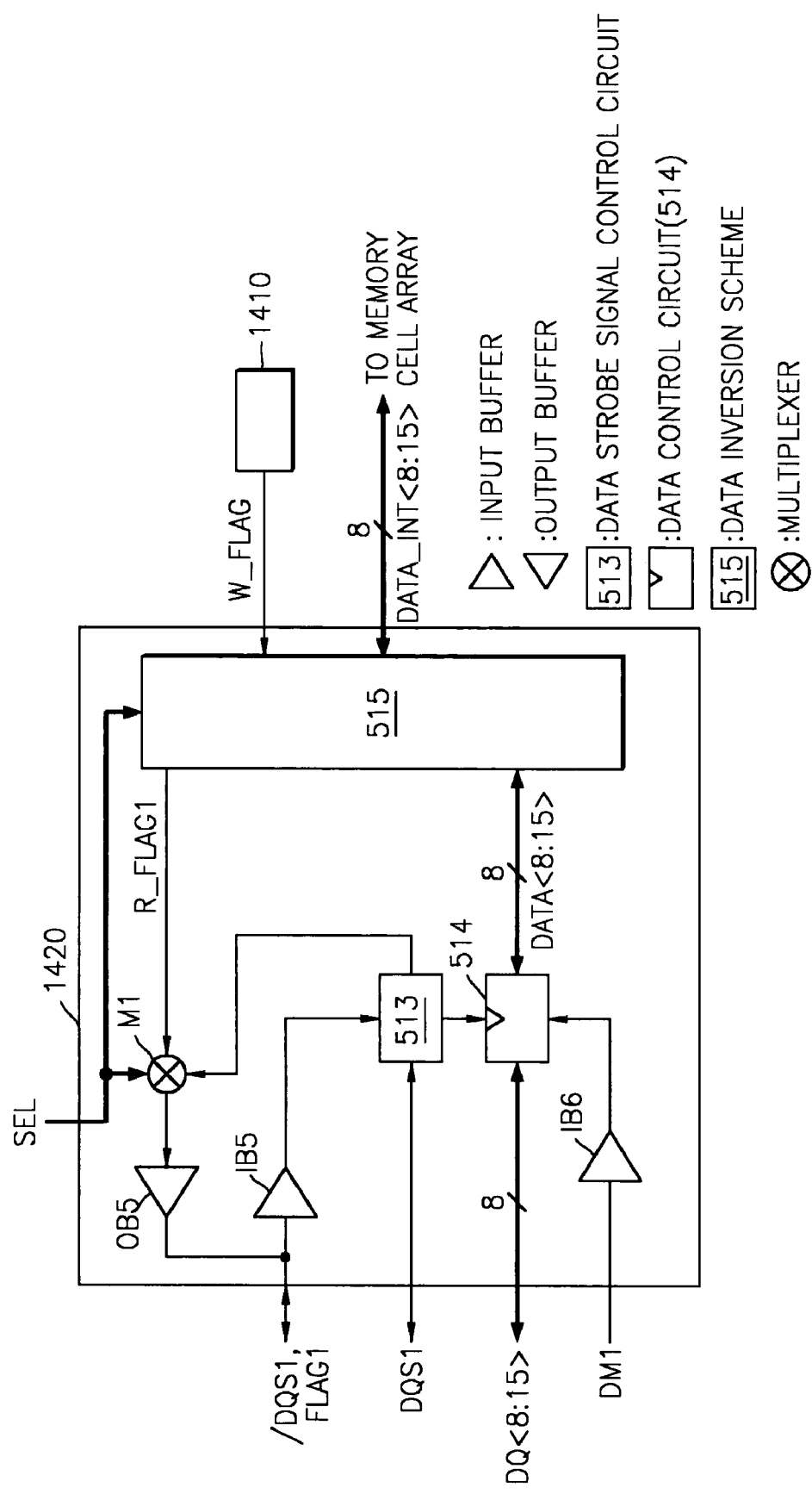
FIG. 32 shows a block diagram of a third embodiment of a data processing circuit according to one or more aspects of the present invention.

FIG. 32 shows a block diagram of a third embodiment of a data processing circuit 1420, in this case a byte1 data processing circuit. The data processing circuits 1430 and 1440 in FIG. 30 are configured similarly to data processing circuit 1420. The data processing circuit 1420 is similar to the data processing circuit 1410, except that it omits the multiplexer M2 and instead receives the W_FLAG write data inversion flag from the multiplexer M2 of the byte0 data processing circuit 1410. Accordingly, the /DQS1,FLAG1 signal is always provided to the data strobe signal control circuit 513 of the data processing circuit 1420.

Figure 33:
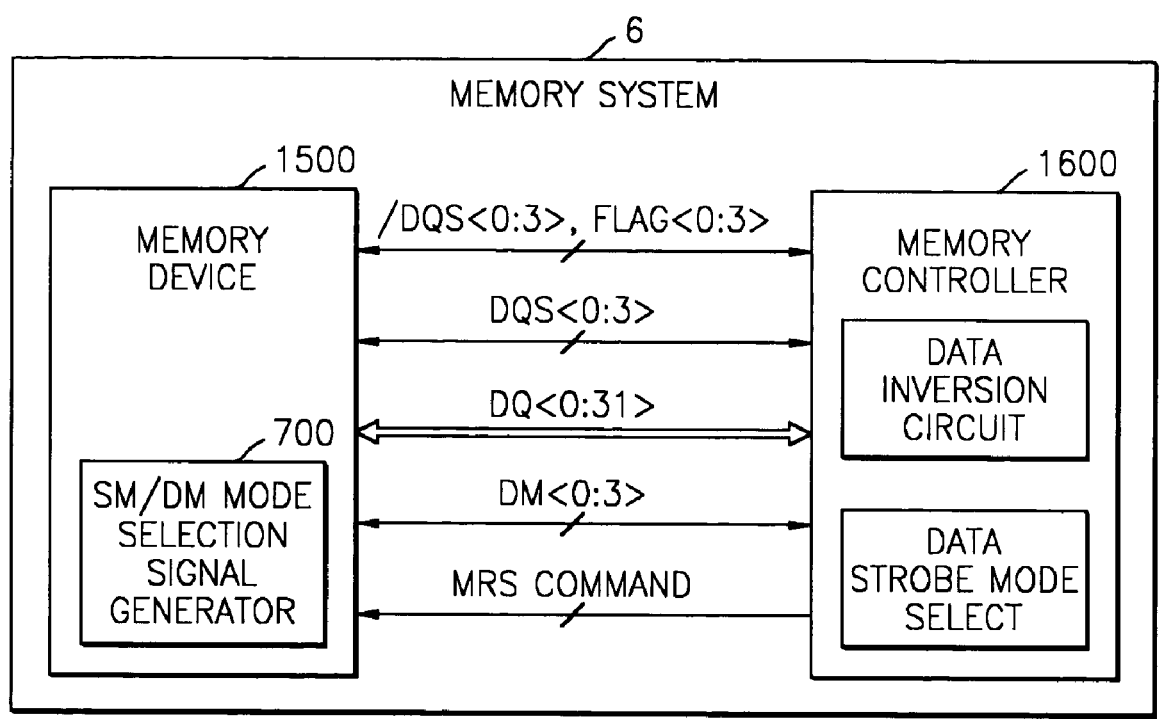
FIG. 33 shows a block diagram of a fourth embodiment of a memory system according to one or more aspects of the present invention.

FIG. 33 shows a block diagram of a fourth embodiment of a memory system 6. The memory system 6 includes a memory device 1500 and a memory controller 1600. The memory device 1500 can operate in a first (single DQS) data strobe mode with data inversion, or in a second (differential DQS) data strobe mode without data inversion. The block diagram of the memory system 6 of FIG. 33 is similar to the block diagram of the memory system 3 of FIG. 14, except that in the memory device 1500, the data mask signals DM<0:3> operate as the read data inversion flags during a data read operation whenever the MRS command indicates that the memory device 1500 is to operate in the first (single DQS) data strobe mode with data inversion, while in the memory device of FIG. 14, the /DQS<0:3>,FLAG<0:3> signals operate as the read data inversion flags whenever the MRS command indicates that the memory device 1500 is to operate in the first (single DQS) data strobe mode with data inversion. In both the memory device 500 of FIG. 14 and 1500 of FIG. 33, the /DQS<0:3>,FLAG<0:3> signals operate as the write data inversion flags during a data write operation whenever the MRS command indicates that the memory device 1500 is to operate in the first (single DQS) data strobe mode with data inversion.

Figure 34:
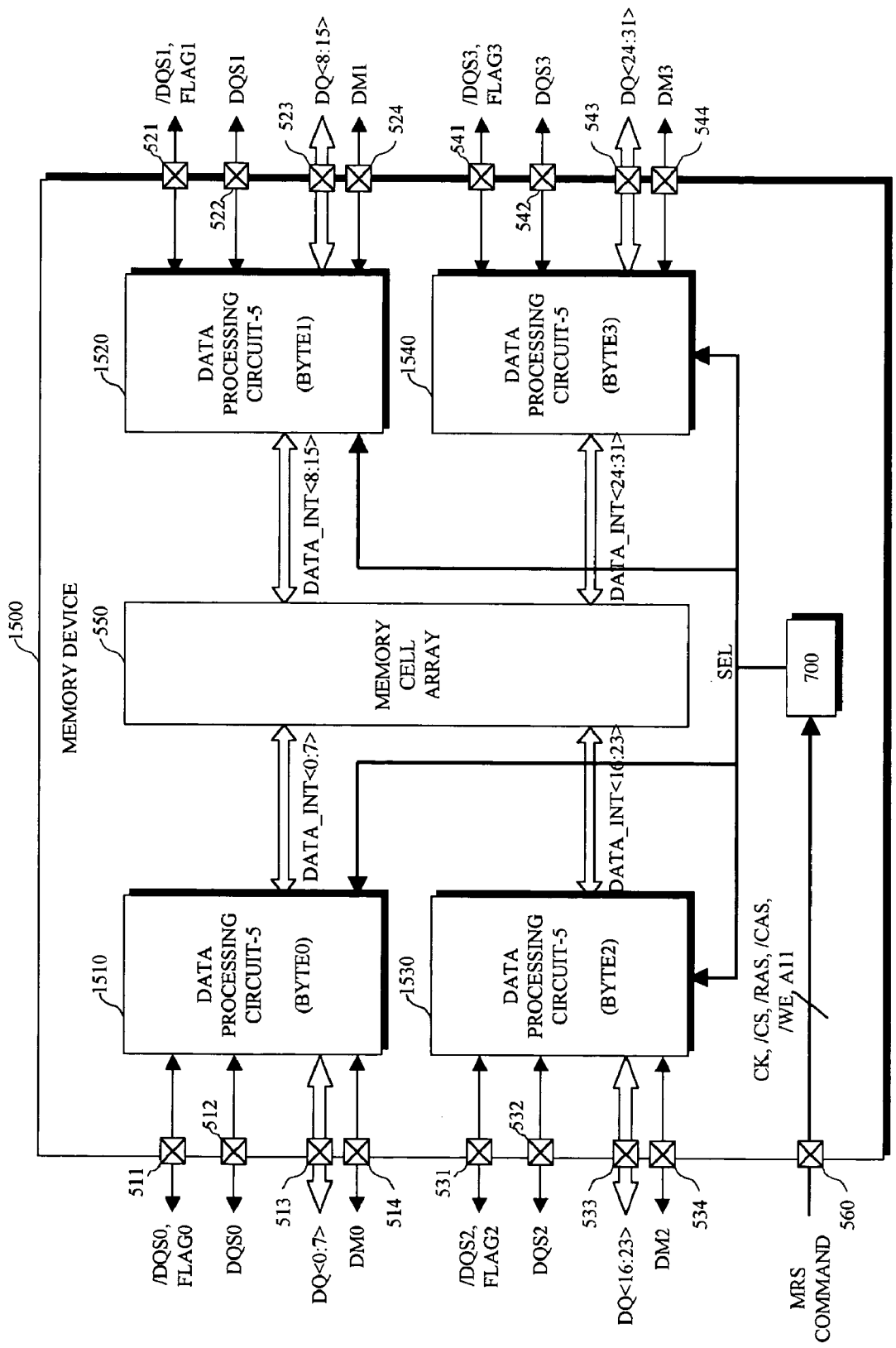
FIG. 34 shows a data processing block diagram of a fourth embodiment of a memory device according to one or more aspects of the present invention.

FIG. 34 shows a data processing block diagram of a fourth embodiment of a memory device 1500. The memory device 1500 includes data processing circuit 1510 for byte0, data processing circuit 1520 for byte1, data processing circuit 1530 for byte2, data processing circuit 1540 for byte3, and memory cell array 550. In the memory device 1500, each single bit of the /DQS<0:3>,FLAG<0:3> data strobe signals at pins 511, 521, 531 and 541, and the DQS<0:3> data strobe signals at pins 512, 522, 532 and 542, is dedicated to one data processing unit 1510, 1520, 1530 or 1540 for processing one eight-bit byte of data for the memory cell array 550. During a data write operation, DM<0:3> at pins 514, 524, 534, and 544, masks write data for the four data processing circuits 1510, 1520, 1530 and 1540. Whenever the MRS command indicates that the memory device 1500 is to operate in the first (single DQS) data strobe mode with data inversion, during a data read operation DM<0:3> function as the read data inversion flags. Four bytes of data comprising DQ<0:31> are input/output at the input/outputs 513, 523, 533 and 543.

Beneficially, the memory device 1500 includes the SM/DM mode selection signal generator 700 that receives the MRS command and in response thereto generates the SM/DM mode selection signal SEL signal that selects either the first or second data strobe mode for the memory device, as will be explained in further detail below. As indicated in FIG. 16, the MRS command may comprise a particular logical combination of a plurality of input signals (e.g., CK, /CS, /RAS, /CAS, /WE and A11).

Figure 35:
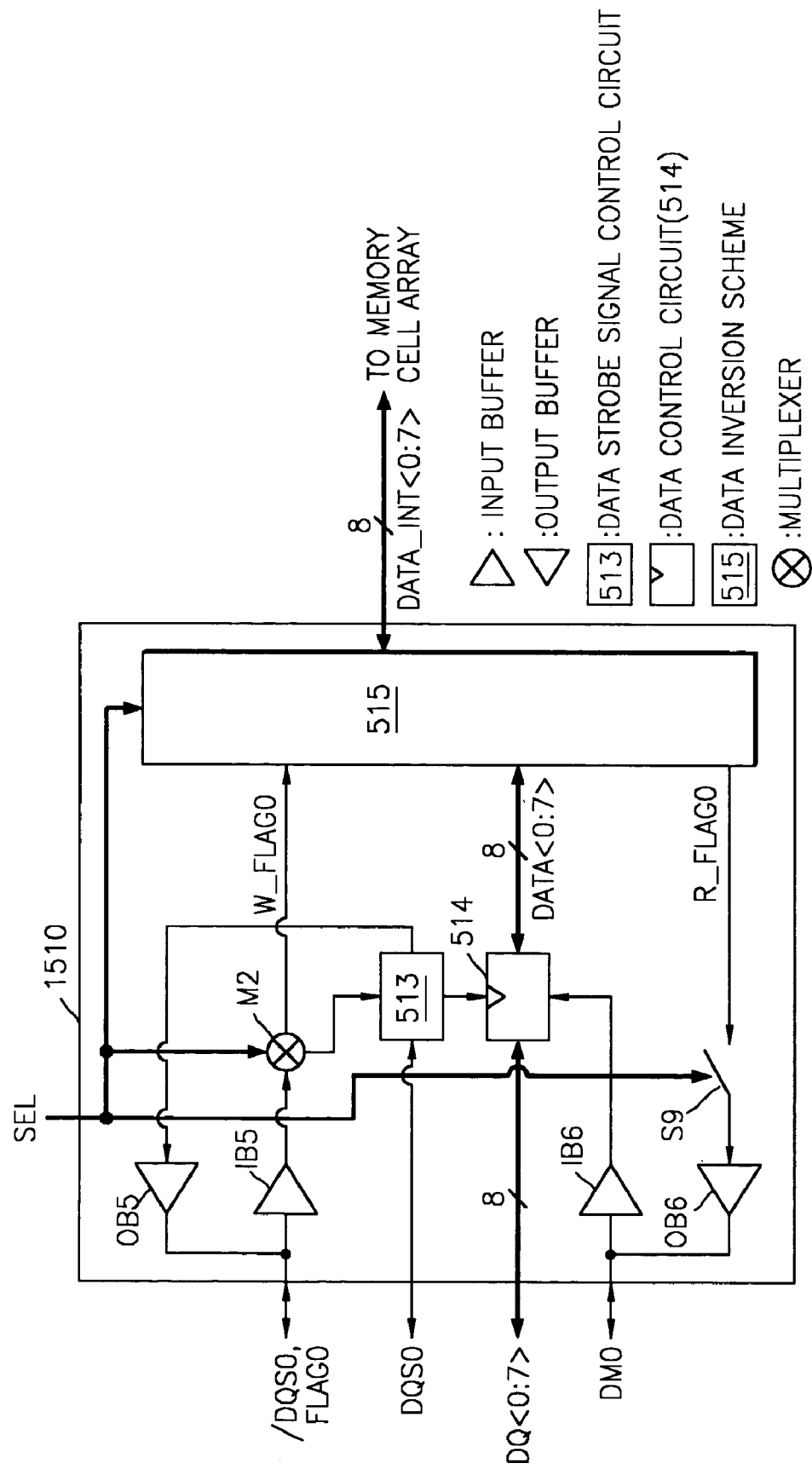
FIG. 35 shows a block diagram of a fourth embodiment of a data processing circuit according to one or more aspects of the present invention.

FIG. 35 shows a block diagram of a first embodiment of the byte0 data processing circuit 1510 of the memory device 1500. The data processing circuits 1520, 1530, and 1540 in FIG. 34 are configured similarly to data processing circuit 1510. The data processing circuit 1510 comprises a number of components, including data strobe signal control circuit 513, data control circuit 514, and the data inversion block 515. The data strobe signal control circuit 513 generates the read data strobe signal DQS0. Data control circuit 514 controls data input/output during both data read and data write operations. DM0 masks write data during a data write operation. Whenever the SM/DM mode selection signal SEL signal indicates that the memory device 1500 is operating in the first (single DQS) data strobe mode with data inversion, during a data read operation DM0 functions as a read data inversion flag. The data inversion block 515 performs a data inversion process during data read and write operations according to the flags R_FLAG0 and W_FLAG0 flags, when the memory device 500 operates in the first (single DQS) data strobe mode with data inversion in response to the SM/DM mode selection signal SEL signal. In response to the SM/DM mode selection signal SEL, multiplexer M2 switches the /DQS0,FLAG0 data strobe signal between functioning as a write data inversion flag in the first (single DQS) data strobe mode with data inversion, and functioning as a differential data strobe signal in the second (differential DQS) data strobe mode without data inversion. Meanwhile, during a data read operation, switch S9 provides the RFLAG0 to the DM0 pin as a read data inversion flag when the memory device 1500 operates in the first (single DQS) data strobe mode in response to the SM/DM mode selection signal SEL.

Figure 36:
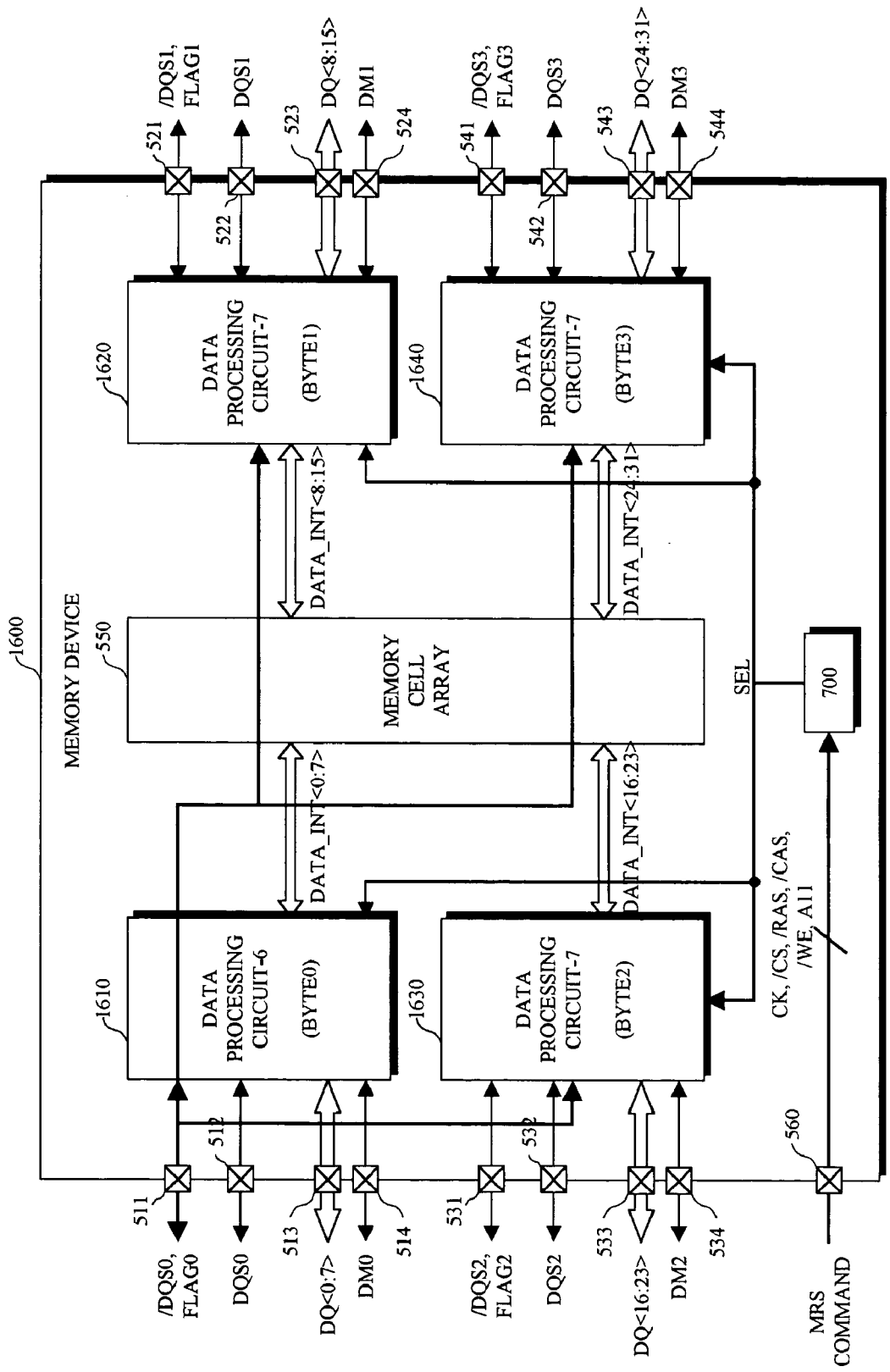
FIG. 36 shows a data processing block diagram of a fifth embodiment of a memory device according to one or more aspects of the present invention.

FIG. 36 shows a data processing block diagram of a fifth embodiment of a memory device 1600. FIG. 36 is similar to the data processing diagram of the memory device 1500 as shown in FIG. 34, except that the byte0 data processing circuit 1610 generates the write data inversion flag W_FLAG for the other three data processing circuits 1620, 1630, and 1640.

Figure 37:
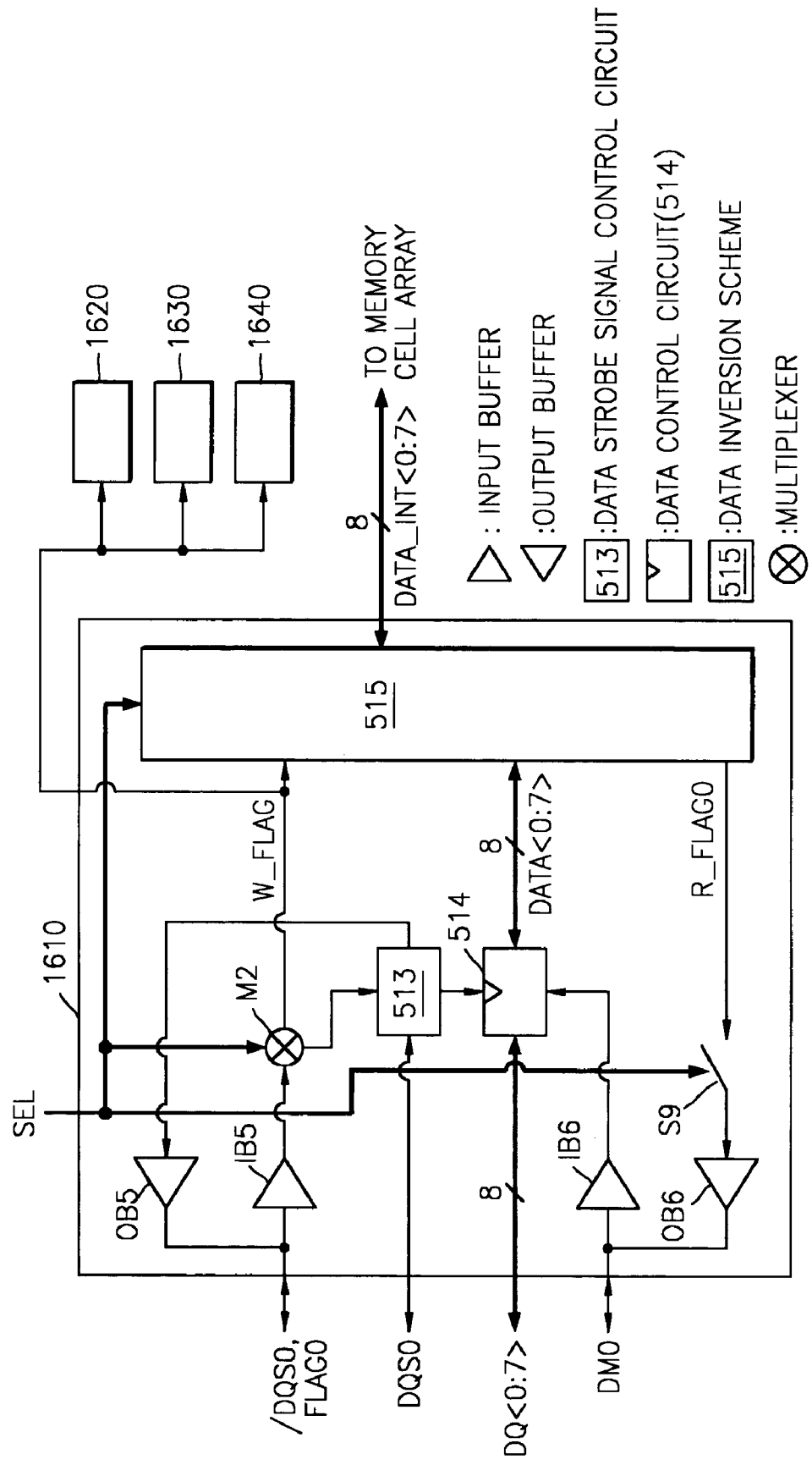
FIG. 37 shows a block diagram of a fifth embodiment of a data processing circuit according to one or more aspects of the present invention.

FIG. 37 shows a block diagram of a fifth embodiment of a data processing circuit 1610. The data processing circuits 1620, 1630, and 1640 in FIG. 36 are configured differently from the data processing circuit 1610, as will be explained in further detail below. The data processing circuit 1610 comprises a number of components, including data strobe signal control circuit 513, data control circuit 514, and the data inversion block 515. The data strobe signal control circuit 513 generates the read data strobe signal DQS0. Data control circuit 514 controls data input/output during both data read and data write operations. DM0 masks write data during a data write operation. Whenever the SM/DM mode selection signal SEL signal indicates that the memory device 1600 is operating in the first (single DQS) data strobe mode with data inversion, during a data read operation DM0 functions as a read data inversion flag. The data inversion block 515 performs a data inversion process during read and write operations according to the flags R_FLAG0 and W_FLAG when the memory device 1600 operates in the first (single DQS) data strobe mode with data inversion in response to the SM/DM mode selection signal SEL signal. In response to the SM/DM mode selection signal SEL, multiplexer M2 switches the /DQS0,FLAG0 data strobe signal between functioning as a write data inversion flag in the first (single DQS) data strobe mode with data inversion, and functioning as a differential data strobe signal in the second (differential DQS) data strobe mode without data inversion. Meanwhile, during a data read operation switch S9 provides the RFLAG0 to the DM0 data mask line as a read data inversion flag when the memory device 1500 operates in the first (single DQS) data strobe mode in response to the SM/DM mode selection signal SEL.

In the byte0 data processing circuit 1610, the multiplexer M2 receives the /DQS0,FLAG0 signal and, in response to the SM/DM mode selection signal SEL indicating the first (single DQS) data strobe mode with data inversion, generates a W_FLAG signal for all four data processing circuits 1610, 1620, 1630, and 1640 processing all four bytes to be written into the memory cell array 550.

Figure 38:
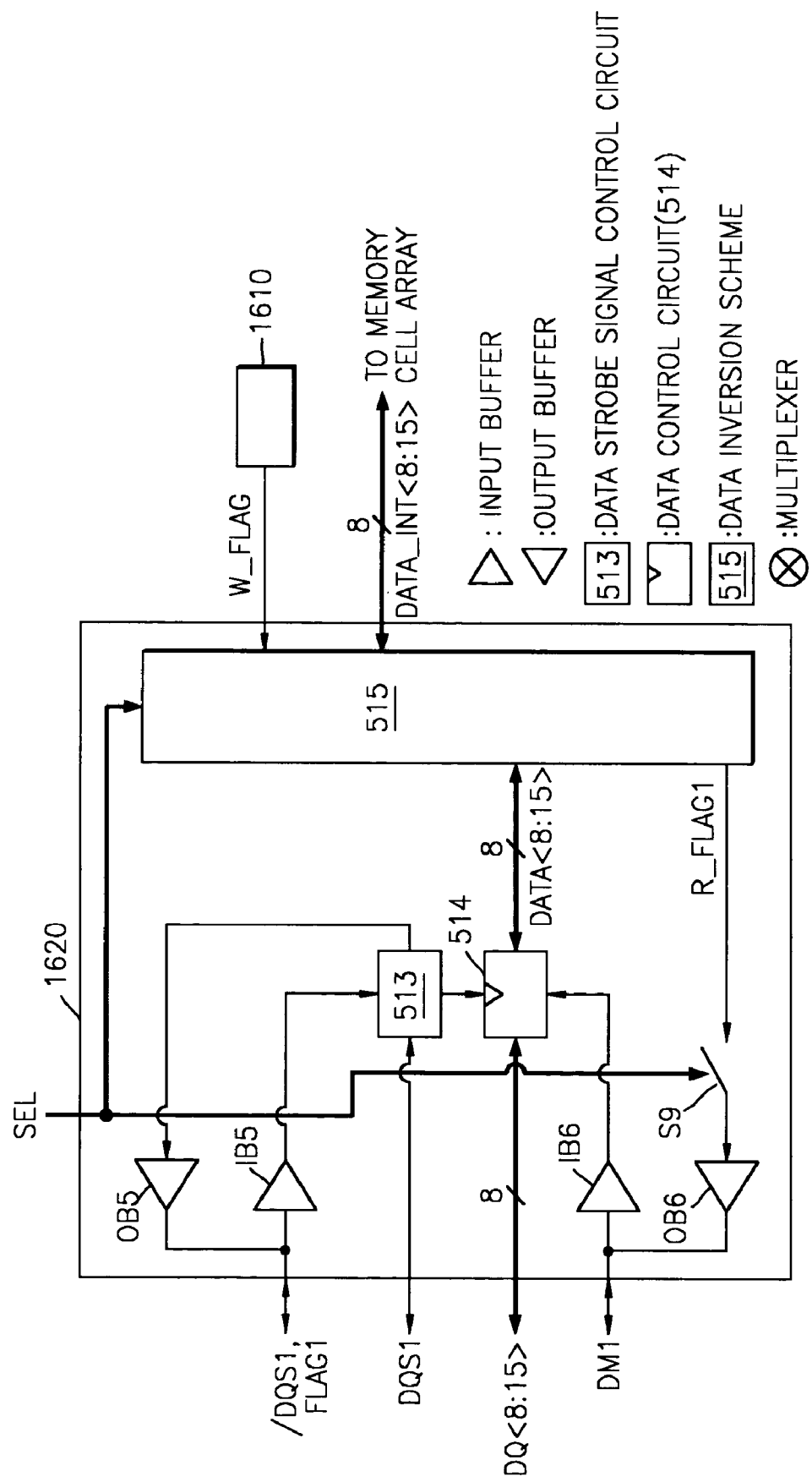
FIG. 38 shows a block diagram of a sixth embodiment of a data processing circuit according to one or more aspects of the present invention.

FIG. 38 shows a block diagram of a sixth embodiment of a data processing circuit 1420, in this case a byte1 data processing circuit. The data processing circuits 1630 and 1640 in FIG. 36 are configured similarly to data processing circuit 1620. The data processing circuit 1620 is similar to the data processing circuit 1610, except that it omits the multiplexer M2 and instead receives the W_FLAG write data inversion flag from the multiplexer M2 of the byte0 data processing circuit 1610. Accordingly, the /DQS1,FLAG1 signal is always provided to the data strobe signal control circuit 513 of the data processing circuit 1620.

Figure 39:
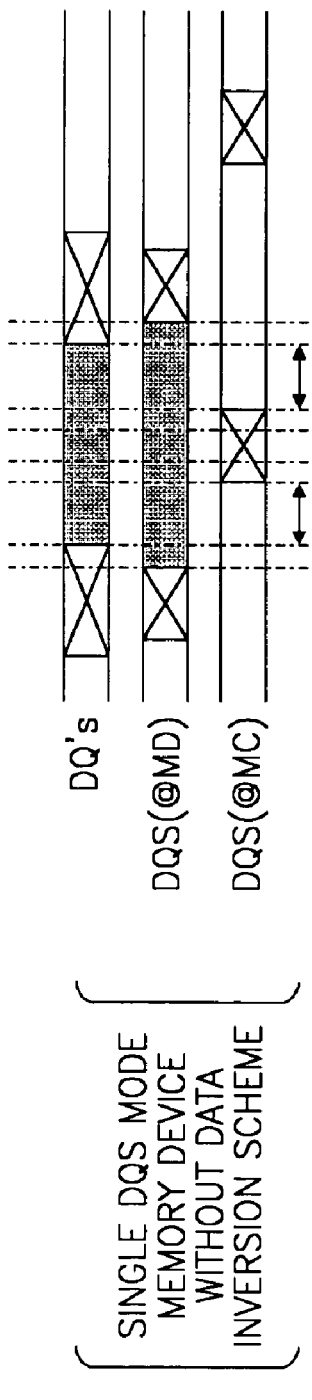
FIG. 39 shows a timing diagram of a single DQS mode memory device.
Figure 40:
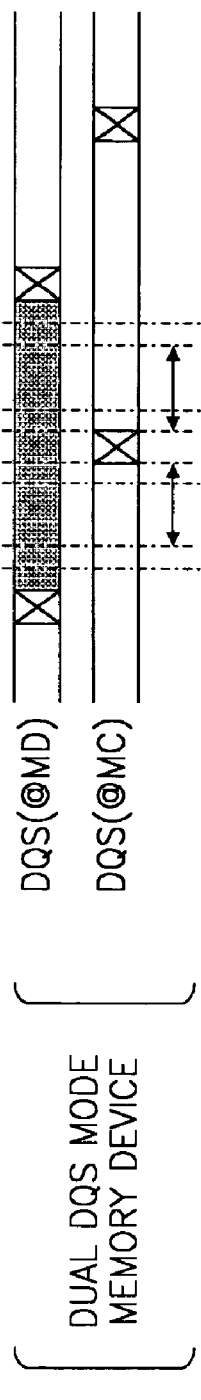
FIG. 40 shows a timing diagram of a dual (differential) DQS mode memory device.
Figure 41:
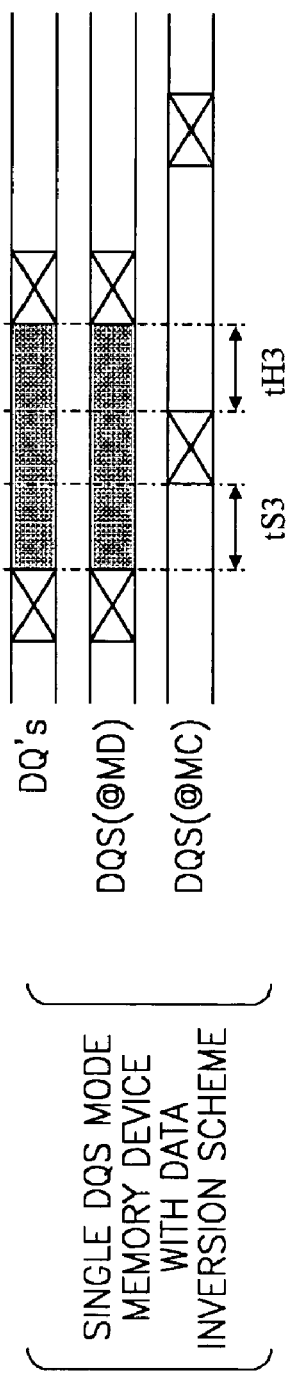
FIG. 41 shows a timing diagram of a single DQS mode memory device with a data inversion scheme.

FIG. 39 shows a timing diagram of a single DQS mode memory device, FIG. 40 shows a timing diagram of a dual (differential) DQS mode memory device, and FIG. 41 shows a timing diagram of a single DQS mode memory device with a data inversion scheme.

According to the various embodiments described above, the following features and benefits may be realized. The same memory device may be supplied, stocked, and used for memory systems operating in a single DQS mode with data inversion, and for memory systems operating in a dual (differential) DQS mode. The data strobe operating mode of the memory device may be selected by a mode selection signal. The mode selection signal may be produced from a mode register set (MRS) command, an external pin connection, a fuse signal generator, a bonding connection of a pad, ball, or pin, etc. When the memory device operates in the single DQS mode, data inversion flags may be assigned per byte to improve the frequency characteristic. Also, pin count reduction may be achieved by repurposing the /DQS pins to selectively operate as data strobe signals for dual (differential) DQS mode, or data inversion flags for single DQS mode with data inversion.

While preferred embodiments are disclosed herein, many variations are possible which remain within the concept and scope of the invention. For example, in one variation, a memory system and memory device may use a data strobe mode selection signal to selectively operate in three data strobe modes: single data strobe mode with data inversion, dual (differential) data strobe mode without data inversion, and dual (differential) data strobe mode without data inversion. In that case, for example, the DIM pin may be "added back into" the memory device to provide a signal for selecting the dual (differential) data strobe mode without data inversion. Such variations would become clear to one of ordinary skill in the art after inspection of the specification, drawings and claims herein. The invention therefore is not to be restricted except within the spirit and scope of the appended claims.

I claim:

1. A memory system, comprising:
    a memory device having,
        a memory cell array adapted to store data, and
        a data inversion circuit adapted to selectively invert the data when it is written into and read from the memory cell array;
    a controller connected to the memory device and adapted to write the data into the memory device and to read the data out of the memory device in response to data strobe signals; and
    data strobe mode changing means for selectively changing operation of the memory device between a first data strobe mode and a second data strobe mode,
    wherein in the first data strobe mode the data strobe signals comprise a write data strobe signal for writing data into the memory device and a read data strobe signal for reading data from the memory device, and
    wherein in the second data strobe mode the data strobe signals comprise a pair of differential data strobe signals for writing data into and reading data from the memory device.

2. The memory system of claim 1, wherein the data strobe mode changing means comprises a mode selection signal generator adapted to generate a data strobe mode selection signal.

3. The memory system of claim 2, wherein the data strobe mode selection signal generator produces the data strobe mode selection signal from a mode register set (MRS) command received by the memory device.

4. The memory system of claim 2, wherein the data strobe mode selection signal generator comprises a fuse signal generator having a fuse, and wherein the fuse signal generator generates the data strobe mode selection signal corresponding to whether or not the fuse is cut.

5. The memory system of claim 4, wherein the fuse signal generator generates the data strobe mode selection signal in response to a power-up signal.

6. The memory system of claim 4, wherein the fuse signal generator includes a latch that latches the data strobe mode selection signal.

7. The memory system of claim 1, wherein the data strobe mode changing means comprises a bond wire coupling a pad of the memory device with a voltage level.

8. The memory system of claim 1, wherein the data strobe mode changing means comprises a pin or ball of the memory device being coupled to a voltage level.

9. The memory system of claim 1, wherein the data strobe mode changing means comprises a data strobe mode selection signal line coupled to an external pin or ball of the memory device.

10. The memory system of claim 1, wherein the memory device has an input/output that carries one of the data strobe signals when the memory device operates in the second data strobe mode, and that carries a write data inversion flag while writing the data into the memory device and a read data inversion flag while reading the data from the memory device, when the memory device operates in the first data strobe mode.

11. The memory system of claim 10, wherein the write data inversion flag controls write inversion for all bytes of data written into the memory device.

12. The memory system of claim 1, wherein the memory cell array is adapted to store data in a plurality of data words, wherein each data word comprises a plurality of data bytes, and wherein the memory device further comprises means for selectively inverting individual bytes of the data when the data is written into and read from the memory cell array.

13. The memory system of claim 1, wherein the memory device further comprises:
    a first input/output (I/O) that carries one of the data strobe signals when the memory device operates in the second data strobe mode, and that carries a write data inversion flag while writing the data into the memory device when the memory device operates in the first data strobe mode; and
    a second I/O that carries a write data masking signal while writing the data into the memory device when the memory device operates in both the first and second data strobe modes, and that carries a read data inversion flag while reading the data from the memory device when the memory device operates in the first data strobe mode.

14. The memory system of claim 13, wherein the memory cell array is adapted to store data in a plurality of data words, wherein each data word comprises a plurality of data bytes, and wherein the memory device further comprises means for selectively inverting individual bytes of the data when the data is written into and read from the memory cell array.

15. The memory system of claim 13, wherein the write inversion flag controls write inversion for all bytes of data written into the memory device.

16. The memory system of claim 1, wherein the memory device further comprises a flag reset circuit that resets a write data inversion flag and a read data inversion flag when the memory device operates in the second data strobe mode.

17. A memory device, comprising:
a memory cell array adapted to store data;
a data input/output (I/O) bus adapted to write data into and read data from the memory device;
a data inversion circuit adapted to selectively invert the data when it is written into and read from the memory cell array; and
data strobe mode changing means for selectively changing operation of the memory device between a first data strobe mode and a second data strobe mode,
wherein in the first data strobe mode the data strobe signals comprise of a write data strobe signal for writing data into the memory device and a read data strobe signal for reading data from the memory device, and
wherein in the second data strobe mode the data strobe signals comprise a pair of differential data strobe signals for writing data into and reading data from the memory device.

18. The memory device of claim 17, wherein the data strobe mode changing means comprises a mode selection signal generator adapted to generate a data strobe mode selection signal.

19. The memory device of claim 18, wherein the data strobe mode selection signal generator comprises a fuse signal generator having a fuse, and wherein the fuse signal generator generates the data strobe mode selection signal corresponding to whether or not the fuse is cut.

20. The memory device of claim 19, wherein the fuse signal generator generates the data strobe mode selection signal in response to a power-up signal.

21. The memory device of claim 19, wherein the fuse signal generator includes a latch that latches the data strobe mode selection signal.

22. The memory device of claim 17, wherein the data strobe mode selection signal generator comprises a decoder adapted to decode a mode register set (MRS) command input to the memory device.

23. The memory device of claim 17, wherein the data strobe mode changing means comprises a bond wire coupling a pad of the memory device with a voltage level.

24. The memory device of claim 17, wherein the data strobe mode changing means comprises a pin or ball of the memory device being coupled to a voltage level.

25. The memory device of claim 17, wherein the data strobe mode changing means includes a data strobe mode selection signal input adapted to receive a data mode strobe selection signal.

26. The memory device of claim 17, further comprising an input/output that carries one of the data strobe signals when the memory device operates in the second data strobe mode, and that carries a write data inversion flag while writing the data into the memory device and a read data inversion flag while reading the data from the memory device, when the memory device operates in the first data strobe mode.

27. The memory device of claim 26, wherein the write data inversion flag controls write inversion for all bytes of data written into the memory device.

28. The memory device of claim 17, wherein the memory cell array is adapted to store data in a plurality of data words, wherein each data word comprises a plurality of data bytes, and wherein the memory device further comprises means for selectively inverting individual bytes of the data when the data is written into and read from the memory cell array.

29. The memory device of claim 17, further comprising:
a first input/output (I/O) that carries one of the data strobe signals when the memory device operates in the second data strobe mode, and that carries a write data inversion flag while writing the data into the memory device when the memory device operates in the first data strobe mode; and
a second I/O that carries a write data masking signal while writing the data into the memory device when the memory device operates in both the first and second data strobe modes, and that carries a read data inversion flag while reading the data from the memory device when the memory device operates in the first data strobe mode.

30. The memory device of claim 17, further comprising a flag reset circuit that resets a write data inversion flag and a read data inversion flag when the memory device operates in the second data strobe mode.

31. A controller adapted to write data into a memory device and to read the data out of the memory device in response to data strobe signals, the controller comprising:
a data input/output (I/O) bus through which the controller writes data to, and reads data from, a memory device;
a data inversion circuit adapted to selectively invert the data when it is written from the controller and read into the controller; and
data strobe mode changing means for selectively changing operation of the memory device between a first data strobe mode and a second data strobe mode,
wherein in the first data strobe mode the data strobe signals comprise a write data strobe signal for writing data into the memory device and a read data strobe signal for reading data from the memory device, and
wherein in the second data strobe mode the data strobe signals comprise a pair of differential data strobe signals for writing data into and reading data from the memory device.

32. The controller of claim 31, wherein the data strobe mode changing means comprises a mode register set (MRS) command output by the controller.

33. The controller of claim 31, wherein the data strobe mode changing means includes a data strobe mode selection output adapted to provide a data strobe mode selection signal from the controller to the memory device.

34. The controller of claim 31, further comprising an input/output that carries a write data inversion flag while writing the data into the memory device and a read data inversion flag while reading the data from the memory device when the memory device operates in the second data strobe mode.

35. A memory device, comprising:
a memory cell array adapted to store data;
a data input/output (I/O) bus through which the data is written into and read from the memory device;
a data inversion circuit adapted to selectively invert the data when it is written into and read from the memory cell array; and
data strobe mode changing means for selectively changing operation of the memory device between a first data strobe mode, a second data strobe mode, and a third data strobe mode,
wherein in the first data strobe mode the data strobe signals comprise a write data strobe signal for writing data into the memory device and a read data strobe signal for reading data from the memory device and the data inversion circuit is controlled to selectively invert the data,
wherein in the second data strobe mode the data strobe signals comprise a pair of differential data strobe signals for writing data into and reading data from the memory device without any data inversion, and
wherein in the third data strobe mode the data strobe signals comprise a pair of differential data strobe signals for writing data into and reading data from the memory device and device and the data inversion circuit is controlled to selectively invert the data.

* * * * *